United States Patent
Kim et al.

(10) Patent No.: US 12,100,699 B2
(45) Date of Patent: Sep. 24, 2024

(54) DISPLAY DEVICE

(71) Applicant: Samsung Display Co., LTD., Yongin-si (KR)

(72) Inventors: Kyung Bae Kim, Seongnam-si (KR); No Kyung Park, Hwaseong-si (KR); Chong Chul Chai, Seoul (KR); Do Yeong Park, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 420 days.

(21) Appl. No.: 17/476,948

(22) Filed: Sep. 16, 2021

(65) Prior Publication Data

US 2022/0199598 A1 Jun. 23, 2022

(30) Foreign Application Priority Data

Dec. 23, 2020 (KR) ........................ 10-2020-0182278

(51) Int. Cl.
*H01L 25/16* (2023.01)
*H01L 33/38* (2010.01)
*H01L 33/62* (2010.01)

(52) U.S. Cl.
CPC ............ *H01L 25/167* (2013.01); *H01L 33/38* (2013.01); *H01L 33/62* (2013.01)

(58) Field of Classification Search
CPC ....... H01L 25/167; H01L 33/38; H01L 33/62; H01L 33/20; H01L 25/0753; H01L 27/1214
See application file for complete search history.

(56) References Cited

U.S. PATENT DOCUMENTS

2014/0367705 A1  12/2014 Bibl et al.
2016/0172339 A1   6/2016 Do
(Continued)

FOREIGN PATENT DOCUMENTS

KR     10-1429095      8/2014
KR   10-2020-0010704    1/2020
(Continued)

OTHER PUBLICATIONS

International Search Report corresponding to International Application No. PCT/KR2021/019488 dated Mar. 28, 2022.
(Continued)

*Primary Examiner* — Kyoung Lee
(74) *Attorney, Agent, or Firm* — KILE PARK REED & HOUTTEMAN PLLC

(57) ABSTRACT

A display device includes a first electrode extended in a first direction, a second electrode spaced apart from the first electrode in a second direction and extended in the first direction, a first insulating layer on the first and second electrodes, light-emitting elements on the first insulating layer, each having at least an end disposed on the first electrode or the second electrode, a second insulating layer disposed on the light-emitting elements and extended in the first direction, and a first connection electrode disposed on the first electrode and electrically contacting the light-emitting elements, a second connection electrode disposed on the second electrode and electrically contacting the light-emitting elements. Each of the first and second connection electrodes includes a main portion electrically contacting the light-emitting elements, and a subsidiary portion having a width smaller than a width of the main portion and electrically connected to the main portion.

20 Claims, 25 Drawing Sheets

(56) References Cited

U.S. PATENT DOCUMENTS

2021/0014982 A1\* 1/2021 Bok .................. H05K 1/189
2021/0265324 A1 8/2021 Kong et al.
2021/0288217 A1 9/2021 Li et al.

FOREIGN PATENT DOCUMENTS

KR 10-2020-0010706 1/2020
KR 10-2020-0118937 10/2020

OTHER PUBLICATIONS

Written Opinion corresponding to International Application No. PCT/KR2021/019488 dated Mar. 28, 2022.

\* cited by examiner

DISPLAY DEVICE

CROSS-REFERENCE TO RELATED APPLICATION(S)

This application claims priority to and benefits of Korean Patent Application No. 10-2020-0182278 under 35 U.S.C. § 119 filed on Dec. 23, 2020 in the Korean Intellectual Property Office, the entire contents of which are incorporated herein by reference.

BACKGROUND

1. Technical Field

The disclosure relates to a display device.

2. Description of the Related Art

Display devices become more and more important as multimedia technology evolves. Accordingly, a variety of types of display devices such as organic light-emitting display (OLED) devices and liquid-crystal display (LCD) devices are currently used.

Display devices include a display panel such as an organic light-emitting display panel and a liquid-crystal display panel for displaying images. Among them, a light-emitting display panel may include light-emitting elements. For example, light-emitting diodes (LEDs) may include an organic light-emitting diode using an organic material as a luminescent material, an inorganic light-emitting diode using an inorganic material as a luminescent material.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Aspects of the disclosure provide a display device capable of controlling the number of connected light-emitting elements so that sub-pixels have a uniform luminance.

It should be noted that objects of the disclosure are not limited to the above-mentioned objects, and other objects of the disclosure will be apparent to those skilled in the art from the following descriptions.

According to an embodiment, by selectively connecting electrodes with only the light-emitting elements disposed at a designated location in an emission area of a display device, it is possible to reduce differences in the luminance. In the display device, a certain area of each sub-pixel may be defined as a light-emitting area based on the shape of the connection electrodes, and a uniform number of light-emitting elements can be disposed in the light-emitting area for each sub-pixel. It is thus possible to reduce differences in the luminance between the sub-pixels SPXn in the display device.

It should be noted that effects of the disclosure are not limited to those described above and other effects of the disclosure will be apparent to those skilled in the art from the following descriptions.

According to an embodiment, a display device may include a first electrode extended in a first direction; a second electrode spaced apart from the first electrode in a second direction and extended in the first direction; a first insulating layer disposed on the first electrode and the second electrode; light-emitting elements disposed on the first insulating layer, each of the light emitting elements having at least an end disposed on the first electrode or the second electrode; a second insulating layer disposed on the light-emitting elements and extended in the first direction; and a first connection electrode disposed on the first electrode and electrically contacting the light-emitting elements; a second connection electrode disposed on the second electrode and electrically contacting the light-emitting elements, wherein each of the first connection electrode and the second connection electrode may include a main portion electrically contacting the light-emitting elements; and a subsidiary portion having a width smaller than a width of the main portion and electrically connected to the main portion.

A first distance between a first main portion of the first connection electrode and a second main portion of the second connection electrode may be smaller than a second distance between a first subsidiary portion of the first connection electrode and a second subsidiary portion of the second connection electrode.

The first distance may be smaller than a length of each of the light-emitting elements extended in a direction.

The second distance may be greater than a length of each of the light-emitting elements extended in a direction.

A third distance between the first electrode and the second electrode may be smaller than the length of each of the light-emitting elements.

The light-emitting elements may comprise first-type light-emitting elements having ends electrically contacting the first main portion of the first connection electrode and the second main portion of the second connection electrode, respectively; and second-type light-emitting elements having at least one end not contacting the first connection electrode and the second connection electrode and spaced apart from the first subsidiary portion of the first connection electrode or the second subsidiary portion of the second connection electrode in the second direction.

At least part of the second-type light-emitting elements may have ends not contacting the first connection electrode and the second connection electrode, and spaced apart from the first subsidiary portion of the first connection electrode and the second subsidiary portion of the second connection electrode in the second direction.

The second insulating layer may overlap the first-type light-emitting elements and the second-type light-emitting elements, and the first main portion and the second main portion may contact side surfaces of the second insulating layer disposed on the light-emitting elements, respectively.

The display device may further comprise a bank surrounding an emission area including the light-emitting elements and a subsidiary area spaced apart from the emission area in the first direction, wherein the first subsidiary portion and the second subsidiary portion may extend from a side of the first main portion and the second main portion in the first direction, respectively, and may be disposed in the subsidiary area.

The first connection electrode may comprise a first electrode contact disposed in the subsidiary area and electrically connected to the first subsidiary portion of the first connection electrode, the second connection electrode may comprise a second electrode contact disposed in the subsidiary area and electrically connected to the second subsidiary portion of the second connection electrode, and the first electrode contact and the second electrode contact may electrically contact the first electrode and the second electrode, respectively.

The first connection electrode may further comprise another first subsidiary portion electrically connected to an opposite side of the first main portion of the first connection electrode in the first direction, the second connection electrode may further comprise another second subsidiary portion electrically connected to an opposite side of the second main portion of the second connection electrode in the first direction, and the emission area may comprise a light-emitting area including the first main portion and the second main portion; and a non-light-emitting area including the first subsidiary portion and second subsidiary portion as an area other than the light-emitting area.

A length of the second insulating layer measured in the first direction may be greater than a width of the light-emitting area in the first direction.

According to an embodiment, a display device may include electrodes extended in a first direction and spaced apart from one another in a second direction perpendicular to the first direction, the electrodes may include a first electrode; a second electrode spaced apart from the first electrode in the second direction; a third electrode disposed between the first electrode and the second electrode; and a fourth electrode spaced apart from the second electrode in the second direction; a first insulating layer disposed on the electrodes, first light-emitting elements having ends disposed on the first electrode and the third electrode, respectively, and disposed in the first direction; and second light-emitting elements having ends disposed on the second electrode and the fourth electrode, respectively, and disposed in the first direction; a second insulating layer comprising a first pattern portion disposed on the first light-emitting elements and extended in the first direction; and a second pattern portion disposed on the second light-emitting elements and extended in the first direction; and connection electrodes including a first connection electrode disposed on the first electrode; a second connection electrode disposed on the second electrode; a third connection electrode disposed across the first electrode and the third electrode; a fourth connection electrode disposed across the third electrode and the fourth electrode; and a fifth connection electrode disposed across the second electrode and the fourth electrode, wherein each of the connection electrodes may include a main portion electrically contacting the light-emitting elements; and a subsidiary portion having a width smaller than a width of the main portion and electrically connected to the main portion, the main portion and the subsidiary portion of each of the connection electrodes may be spaced apart from and face connection electrodes in the second direction, and a first distance between the main portion may be smaller than a second distance between the subsidiary portions.

The first distance may be smaller than a length of the light-emitting elements extended in a direction.

The second distance may be greater than a length of the light-emitting elements extended in a direction.

The light-emitting elements may comprise a first-type light-emitting element having ends electrically contacting the main portion of each of the connection electrodes, respectively; and a second-type light-emitting element having at least one end not contacting the connection electrodes and spaced apart from the subsidiary portion of each of the connection electrodes in the second direction.

The second insulating layer may comprise a first support pattern partially disposed on the second electrode and the third electrode and extended in the first direction; and bridges having a shape extended in the second direction and electrically connected to at least one of the first pattern portion and the second pattern portion, and the first support pattern.

Each of the first support pattern and the bridges may have a larger width than a width of the first pattern portion and the second pattern portion.

The first support pattern may be spaced apart from a second main portion of the second connection electrode and a third main portion of the third connection electrode.

The first pattern portion may electrically contact a main portion of the first connection electrode and a main portion of the third connection electrode, and the second pattern portion may electrically contact a main portion of the second connection electrode and a main portion of the fourth connection electrode.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
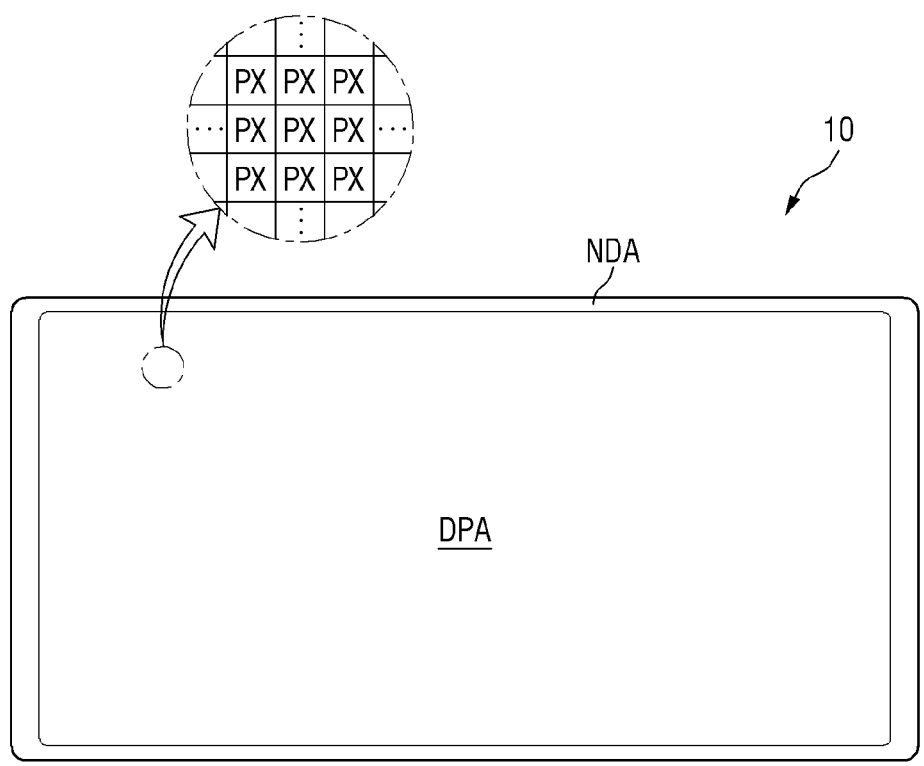
FIG. 1 is a schematic plan view of a display device according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the drawings, sizes, thicknesses, ratios, and dimensions of the elements may be exaggerated for ease of description and for clarity. Like numbers refer to like elements throughout.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B."

It will also be understood that when a layer is referred to as being "on" another layer or substrate, it can be directly on the other layer or substrate, or intervening layers may also be present. The same reference numbers indicate the same components throughout the specification.

It will be understood that when an element (or a region, a layer, a portion, or the like) is referred to as "being on", "connected to" or "coupled to" another element in the specification, it can be directly disposed on, connected or coupled to another element mentioned above, or intervening elements may be disposed therebetween.

It will be understood that the terms "connected to" or "coupled to" may include a physical or electrical connection or coupling.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

The phrase "in a plan view" means viewing the object from the top, and the phrase "in a schematic cross-sectional view" means viewing a cross-section of which the object is vertically cut from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments of the disclosure will be described with reference to the accompanying drawings.

FIG. 1 is a schematic plan view of a display device according to an embodiment.

Referring to FIG. 1, the display device 10 displays a moving image or a still image. A display device 10 may refer to any electronic device that provides a display screen. For example, the display device 10 may include a television set, a laptop computer, a monitor, an electronic billboard, the Internet of Things devices, a mobile phone, a smart phone, a tablet personal computer (PC), an electronic watch, a smart watch, a watch phone, a head-mounted display device, a mobile communications terminal, an electronic notebook, an electronic book, a portable multimedia player (PMP), a navigation device, a game console and a digital camera, a camcorder, etc. within the spirit and the scope of the disclosure.

The display device 10 may include a display panel for providing a display screen. Examples of the display panel may include an inorganic light-emitting diode display panel, an organic light-emitting display panel, a quantum-dot light-emitting display panel, a plasma display panel, a field emission display panel, etc. within the spirit and the scope of the disclosure.

In the following description, an inorganic light-emitting diode display panel is employed as an example of the display panel 10, but the disclosure is not limited thereto. Any other display panel may be employed within the disclosure.

The shape of the display device 10 may be modified in a variety of ways. For example, the display device 10 may have shapes such as substantially a rectangle with longer lateral sides, substantially a rectangle with longer vertical sides, substantially a square, substantially a quadrangle with substantially rounded corners (vertices), other polygons, substantially a circle, etc. within the spirit and the scope of the disclosure.

The shape of a display area DPA of the display device 10 may also be similar to the overall shape of the display device 10. In the example shown in FIG. 1, the display device 10 has a substantially rectangular shape with the longer sides in a second direction DR2.

The display device 10 may include the display area DPA and a non-display area NDA. In the display area DPA, images can be displayed. In the non-display area NDA, images are not displayed. The display area DPA may be referred to as an active area, while the non-display area NDA may also be referred to as an inactive area. The display area DPA may generally occupy the majority of the center of the display device 10.

The display area DPA may include pixels PX. The pixels PX may be arranged or disposed in a matrix. The shape of each pixel PX may be, but is not limited to, substantially a rectangle or a square when viewed from the top. Each pixel may have a substantially diamond shape having sides inclined with respect to a direction. The pixels PX may be arranged or disposed in stripes or the PenTile® pattern. Each of the pixels PX may include at least one light-emitting element that emits light of a wavelength band to realize a given color.

The non-display area NDA may be disposed around the display area DPA. The non-display area NDA may surround or may be adjacent to the display area DPA entirely or partially. The display area DPA may have a substantially rectangular shape, and the non-display area NDA may be disposed to be adjacent to the four sides of the display area DPA. The non-display area NDA may form the bezel of the display device 10. Lines or circuit drivers included in the display device 10 may be disposed in each of the non-display area NDA, or external devices may be mounted or disposed.

Figure 2:
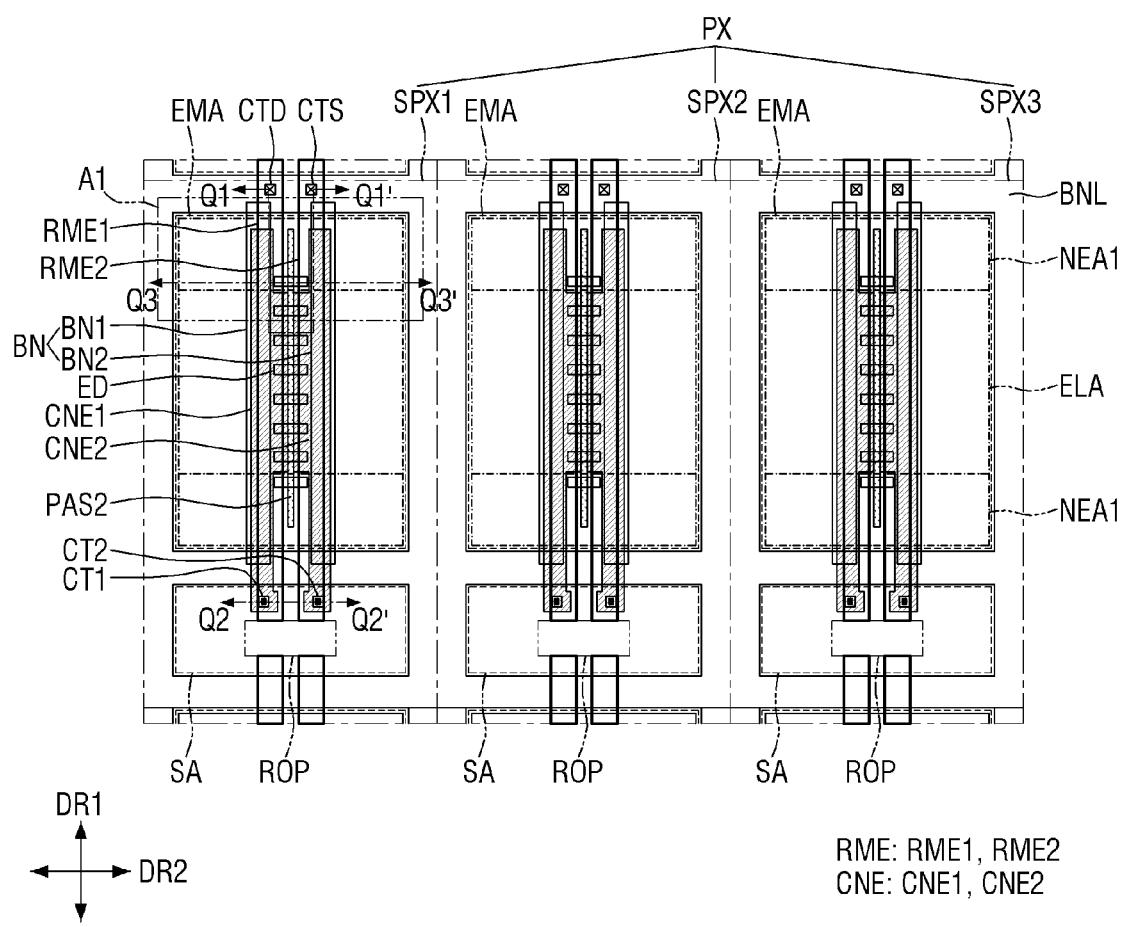
FIG. 2 is a schematic plan view showing a pixel of a display device according to an embodiment.

FIG. 2 is a schematic plan view showing a pixel of a display device according to an embodiment. FIG. 2 shows a pixel PX and a part of another pixel PX adjacent to it in the first direction DR1.

Referring to FIG. 2, each of the pixels PX of the display device 10 may include sub-pixels SPXn, where n is an integer from one to three. For example, a pixel PX may include a first sub-pixel SPX1, a second sub-pixel SPX2 and a third sub-pixel SPX3. The first sub-pixel SPX1 may emit light of a first color, the second sub-pixel SPX2 may emit light of a second color, and the third sub-pixel SPX3 may emit light of a third color. For example, the first color may be blue, the second color may be green, and the third color may be red. It is, however, to be understood that the disclosure is not limited thereto. All the sub-pixels SPXn may emit light of the same color. According to an embodiment, the sub-pixels SPXn may emit blue light. Although the single pixel PX may include three sub-pixels SPXn in the example shown in FIG. 2, the disclosure is not limited thereto. The pixel PX may include more than three sub-pixels SPXn.

Each of the sub-pixels SPXn of the display device 10 may include an emission area EMA and a non-emission area. In the emission area EMA, where light-emitting diodes ED are disposed to emit light of a wavelength band. In the non-emission area, the light-emitting diodes ED are not disposed and the lights emitted from the light-emitting diodes ED do not reach, and thus no light exits therefrom.

The emission area may include an area in which the light-emitting diodes ED are disposed, and may include an area adjacent to the light-emitting diodes ED where lights emitted from the light-emitting element ED exit. It is, however, to be understood that the disclosure is not limited thereto. The emission area EMA may also include an area in which light emitted from the light-emitting diode ED is reflected or refracted by other elements to exit. The light-emitting diodes ED may be disposed in each of the sub-pixels SPXn, and the emission area may include the area where the light-emitting elements are disposed and the adjacent area.

Although the emission areas EMA of the sub-pixels SPXn have the uniform area in the example shown in the drawings, the disclosure is not limited thereto. In an embodiment, the emission areas EMA of the sub-pixels SPXn may have different areas depending on a color or wavelength band of light emitted from the light-emitting diodes ED disposed in the respective sub-pixels.

Each of the sub-pixels SPXn may further include a subsidiary area SA disposed in the non-emission area. The subsidiary area SA may be disposed on the lower side of the emission area EMA in the first direction DR1, and may be disposed between the emission areas EMA of the sub-pixels SPXn adjacent to each other in the first direction DR1. For example, the emission areas EMA and the subsidiary areas SA may be arranged or disposed repeatedly in the second direction DR2, and may be arranged or disposed alternately in the first direction DR1. It is, however, to be understood that the disclosure is not limited thereto. The emission areas EMA and the subsidiary areas SA of the pixels PX may have an arrangement different from that of FIG. 2. No light-emitting diode ED is disposed in the subsidiary areas SA and thus no light exits therefrom. The electrodes RME disposed in the sub-pixels SPXn may be partially disposed in the subsidiary areas SA. The electrodes RME disposed in different sub-pixels SPXn may be disposed separately from one another at separation regions ROP of the subsidiary areas SA.

A bank BNL is disposed between the emission areas EMA and the subsidiary areas SA. The bank BNL may be disposed in a lattice pattern on the front surface of the display area DPA including portions extended in the first direction DR1 and the second direction DR2 when viewed from the top. The bank BNL may be disposed along the border of each of the sub-pixels PXn to distinguish between adjacent sub-pixels PXn. The bank BNL may be disposed to surround the emission area EMA disposed in each of the sub-pixels SPXn to distinguish between them. The distances between the emission areas EMA, between the subsidiary areas SA and between the emission areas EMA and the subsidiary areas SA may vary according to the width of the bank BNL.

Figure 3:
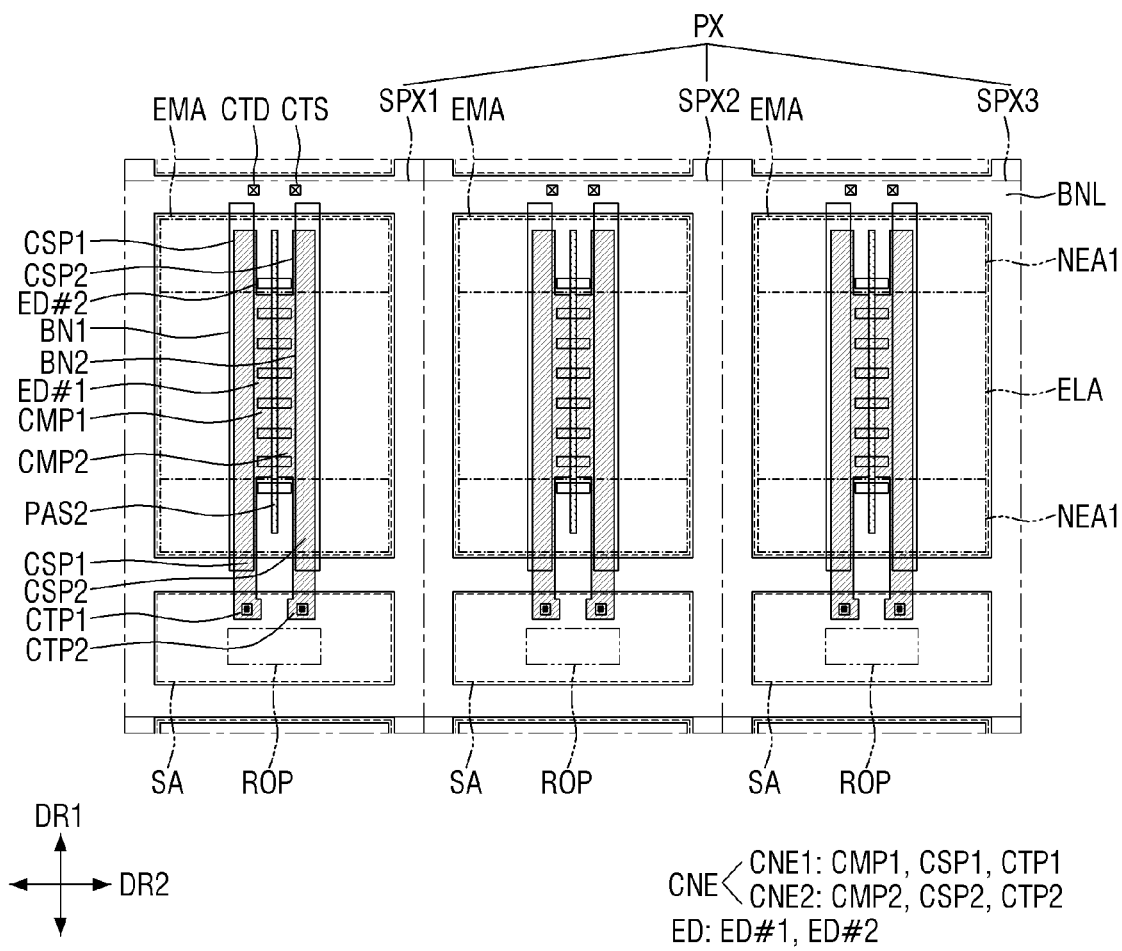
FIG. 3 is a schematic plan view showing relative arrangements of protruding patterns, a bank, connection electrodes, and light-emitting diodes disposed on one pixel of FIG. 2.
Figure 4:
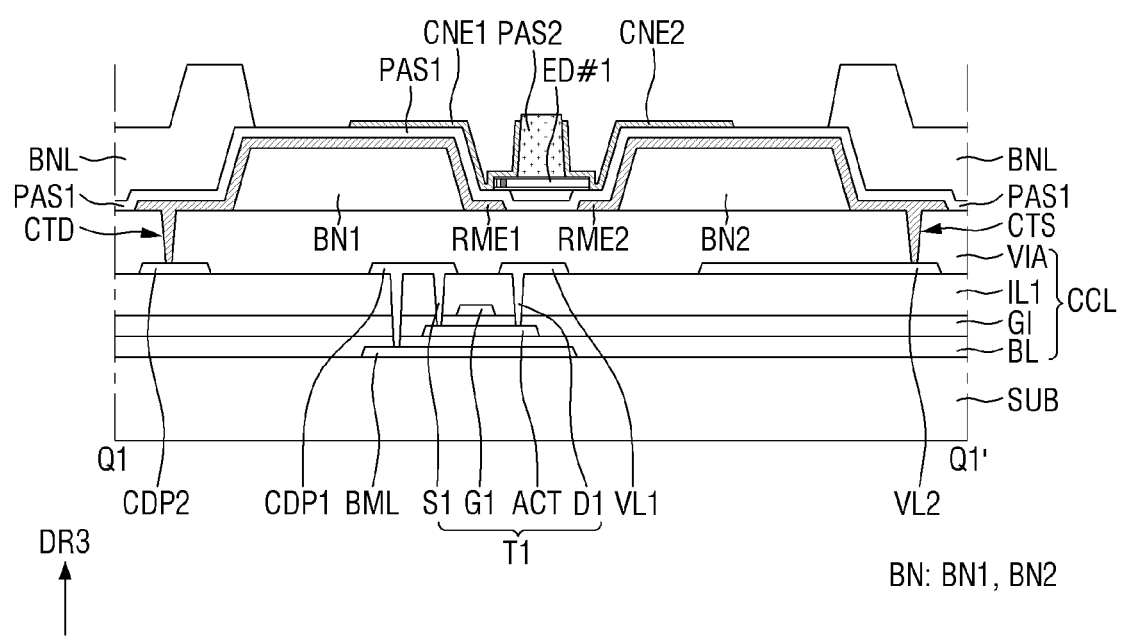
FIG. 4 is a schematic cross-sectional view taken along line Q1-Q1' of FIG. 2.
Figure 5:
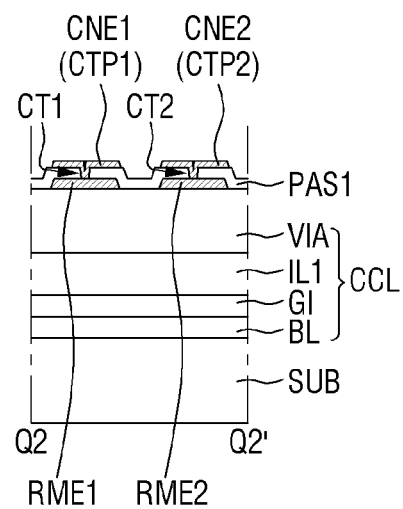
FIG. 5 is a schematic cross-sectional view taken along line Q2-Q2' of FIG. 2.
Figure 6:
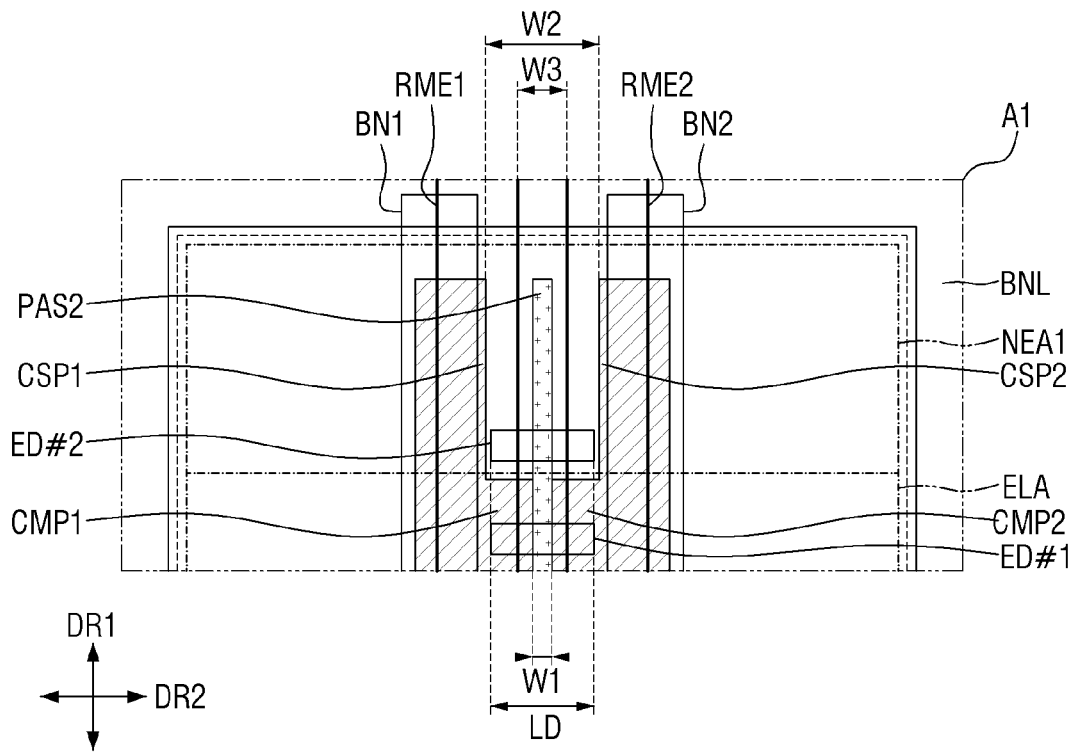
FIG. 6 is an enlarged view of portion A1 of FIG. 2.
Figure 7:
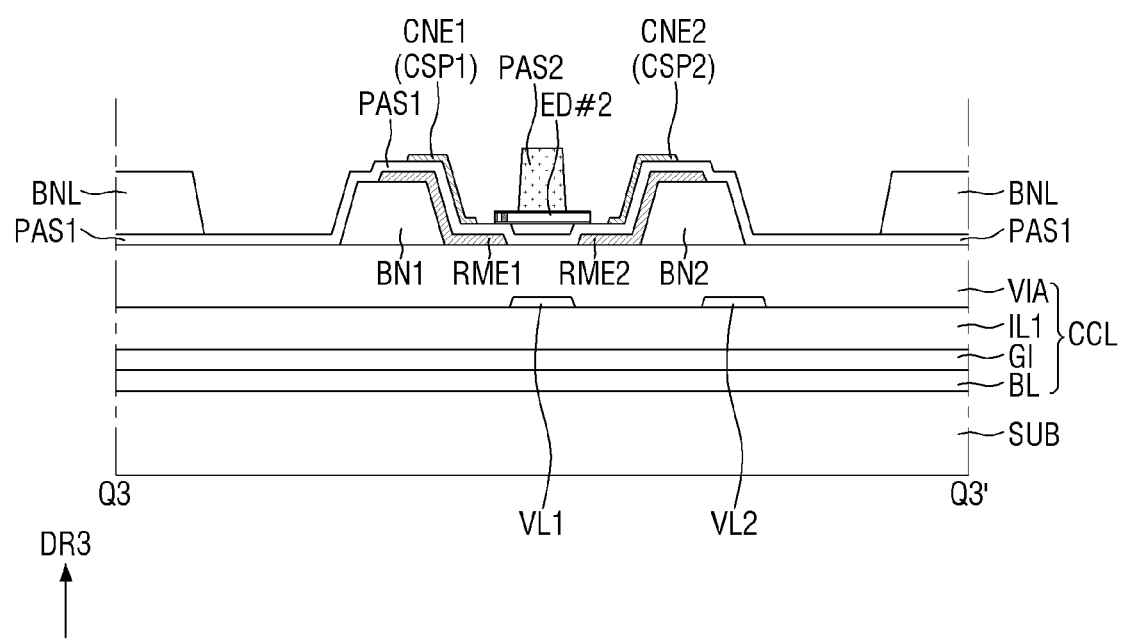
FIG. 7 is a schematic cross-sectional view taken along line Q3-Q3' of FIG. 2.

FIG. 3 is a schematic plan view showing relative arrangements of protruding patterns, a bank, connection electrodes, and light-emitting diodes disposed on one pixel of FIG. 2. FIG. 4 is a schematic cross-sectional view taken along line Q1-Q1' of FIG. 2. FIG. 5 is a schematic cross-sectional view taken along line Q2-Q2' of FIG. 2. FIG. 6 is an enlarged view of portion A1 of FIG. 2. FIG. 7 is a schematic cross-sectional view taken along line Q3-Q3' of FIG. 2.

FIG. 3 depicts only some or a number of the layers disposed in one pixel PX. FIG. 4 shows a cross section passing through both ends of a first-type light-emitting diode ED #1 disposed in a light-emitting area ELA of the first sub-pixel SPX1. FIG. 5 is a view showing a cross section passing through contacts CT1 and CT2 located or disposed in the subsidiary area of the first sub-pixel SPX1. FIG. 6 is an enlarged view based in part on FIG. 2 showing a light-emitting area ELA and a first non-light-emitting area NEA1 of the first sub-pixel SPX1. FIG. 7 shows a cross section passing through both ends of a second-type light-emitting diode ED #2 disposed in a first non-light-emitting area NEA1 of the first sub-pixel SPX1.

Referring to FIGS. 3 to 5 in conjunction with FIG. 2, the display device 10 may include a first substrate SUB, a semiconductor layer disposed on the first substrate SUB, conductive layers, and insulating layers. The semiconductor layer, the conductive layers and the insulating layers may form a circuit layer CCL and a display element layer of the display device 10.

For example, the first substrate SUB may be an insulating substrate. The first substrate SUB may be made of an insulating material such as glass, quartz and a polymer resin. The first substrate SUB may be either a rigid substrate or a flexible substrate that can be bent, folded, or rolled.

A first conductive layer may be disposed on the first substrate SUB. The first conductive layer may include a bottom metal layer BML. The bottom metal layer BML is disposed to overlap an active layer ACT1 of a first transistor T1. The bottom metal layer BML may include a material that blocks light, and thus can prevent light from entering the active layer ACT1 of the first transistor T1. It is, however, to be noted that the bottom metal layer BML may be eliminated.

A buffer layer BL may be disposed on the bottom metal layer BML and the first substrate SUB. The buffer layer BL may be formed on the first substrate SUB to protect the transistors of the pixel PX from moisture permeating through the first substrate SUB that is susceptible to moisture permeation, and may also provide a flat surface.

The semiconductor layer is disposed on the buffer layer BL. The semiconductor layer may include the active layer ACT1 of the first transistor T1. The active layer ACT1 may be disposed to partially overlap a gate electrode G1 of a second conductive layer, which will be described later.

The semiconductor layer may include polycrystalline silicon, monocrystalline silicon, an oxide semiconductor, etc. within the spirit and the scope of the disclosure.

In other embodiments, the semiconductor layer may include polycrystalline silicon. The oxide semiconductor may be an oxide semiconductor containing indium (In). For example, the oxide semiconductor may be at least one of indium tin oxide (ITO), indium zinc oxide (IZO), indium gallium oxide (IGO), indium zinc tin oxide (IZTO), indium gallium tin oxide (IGTO), indium gallium zinc oxide (IGZO), indium-gallium zinc tin oxide (IGZTO), etc. within the spirit and the scope of the disclosure.

Although only one first transistor T1 is disposed in the sub-pixel SPXn of the display device 10 in the drawing, the disclosure is not limited thereto. A larger number of transistors may be included in the display device 10.

A first gate insulator GI is disposed on the semiconductor layer and the buffer layer BL. The first gate insulator GI may work as a gate insulating film of the first transistor T1.

The second conductive layer is disposed on the first gate insulating layer GI. The second conductive layer may include a gate electrode G1 of the first transistor T1. The gate electrode G1 may be disposed so that it overlaps a channel region of the active layer ACT1 in the thickness direction, for example, a third direction DR3.

A first interlayer dielectric layer IL1 is disposed on the second conductive layer. The first interlayer dielectric layer IL1 may work as an insulating film between the second conductive layer and other layers disposed thereon and can protect the second conductive layer.

The third conductive layer is disposed on the first interlayer dielectric layer ILL The third conductive layer may include a first voltage line VL1, a second voltage line VL2, and conductive patterns CDP1 and CDP2.

A high-level voltage (or a first supply voltage) may be applied to the first voltage line VL1 to be transmitted to the first electrode RME1, and a low-level voltage (or a second supply voltage) may be applied to the second voltage line VL2 to be transmitted to the second electrode RME2. A part of the first voltage line VL1 may be in contact with the active layer ACT1 of the first transistor Ti through a contact hole penetrating the first interlayer dielectric layer IL1 and the first gate insulator GI. The first voltage line VL1 may work as the first drain electrode D1 of the first transistor T1. The second voltage line VL2 may be connected or directly connected to the second electrode RME2 to be described later.

The first conductive pattern CDP1 may be in contact with the active layer ACT1 of the first transistor T1 through a contact hole penetrating the first interlayer dielectric layer IL1 and the first gate insulator GI. The first conductive pattern CDP1 may be in contact with the bottom metal layer BML through another contact hole. The first conductive pattern CDP1 may work as a first source electrode S1 of the first transistor T1.

The second conductive pattern CDP2 may be connected to the first electrode RME1 to be described later. The second conductive pattern CDP2 may be electrically connected to the first transistor Ti through the first conductive pattern CDP1. Although the first conductive pattern CDP1 and the second conductive pattern CDP2 are spaced apart from each other in the drawings, the second conductive pattern CDP2 may be integral with the first conductive pattern CDP1 to form a single pattern in some implementations. The first transistor T1 may transmit the first supply voltage applied from the first voltage line VL1 to the first electrode RME1.

Although the first conductive pattern CDP1 and the second conductive pattern CDP2 may be formed or disposed on a same layer in the drawings, the disclosure is not limited thereto. In an embodiment, the second conductive pattern CDP2 may be formed as a conductive layer different from the first conductive pattern CDP1, for example, a fourth conductive layer disposed above the third conductive layer with some insulating layer between the third conductive layer the fourth conductive layer. In this instance, the first voltage line VL1 and the second voltage line VL2 may also be formed as a fourth conductive layer rather than the third conductive layer. The first voltage line VL1 may be electrically connected to the drain electrode D1 of the transistor Ti through a different conductive pattern.

The buffer layer BL, the first gate insulator GI and the first interlayer dielectric layer IL1 may be made up of multiple inorganic layers stacked each other alternately. For example, the buffer layer BL, the first gate insulating layer GI and the first interlayer dielectric layer IL1 may be made up of a double layer in which inorganic layers including at least one of silicon oxide ($SiO_x$), silicon nitride ($SiN_x$) and silicon oxynitride ($SiO_xN_y$) may be stacked each other or multiple layers in which they may be alternately stacked each other. It is, however, to be understood that the disclosure is not limited thereto. The buffer layer BL, the first gate insulating layer GI and the first interlayer dielectric layer IL1 may be made up of a single inorganic layer including the above-described insulating material. In in an embodiment, the first interlayer dielectric layer IL1 may be made of an organic insulating material such as polyimide (PI).

The second conductive layer and the third conductive layer may be made up of a single layer or multiple layers of one of molybdenum (Mo), aluminum (Al), chromium (Cr), gold (Au), titanium (Ti), nickel (Ni), neodymium (Nd) and copper (Cu) or an alloy thereof. It is, however, to be understood that the disclosure is not limited thereto.

A via layer VIA is disposed on the third conductive layer. The via layer VIA may include an organic insulating material, for example, an organic insulating layer material such as polyimide (PI), to provide a flat surface.

Electrodes RME: RME1 and RME2, protruding patterns BN: BN1 and BN2, a bank BNL, light-emitting diodes ED, and contact electrodes CNE: CNE1 and CNE2 are disposed on the via layer VIA as the display element layer. Passivation layers PAS1 and PAS2 may be disposed on the via layer VIA.

The protruding patterns BN may be disposed on or directly disposed on the via layer VIA. The protruding patterns BN may be disposed in the emission area EMA of the sub-pixel SPXn, may have a shape extended in the first direction DR1 and may be spaced apart from each other in the second direction DR2. For example, the protrusion patterns BN may include a first protruding pattern BN1 disposed on one side or a side of the center of the emission area EMA, for example, the left side, and a second protruding pattern BN2 disposed on the opposite side or another side of the center of the emission area EMA, for example, the right side.

The protruding patterns BN may have the same width, but the disclosure is not limited thereto. Some protruding patterns BN1 and BN2 may have different widths from other protruding patterns. Each of the protruding patterns BN may have a length extended in the first direction DR1 greater than a length of the emission area EMA surrounded by the bank BNL in the first direction DR1. A part of the bank BNL that is extended in the second direction DR2 may overlap the protruding patterns BN. The protruding patterns BN may form an island-like pattern on the front surface of the display area DPA that has a small width and is extended in one direction or a direction in the emission area EMA of each of the sub-pixels SPXn. Light-emitting diodes ED may be disposed between the protruding patterns BN1 and BN2 spaced apart from each other.

The protruding patterns BN may have a structure that at least partly protrudes from the upper surface of the via layer VIA. The protruding part of each of the protruding patterns BN may have inclined or curved side surfaces. Unlike that shown in the drawings, the protruding patterns BN may have a shape substantially of a semi-circle or semi-ellipse having substantially curved outer surface in the schematic cross-sectional view. The protruding patterns BN may include, but is not limited to, an organic insulating material such as polyimide (PI).

The electrodes RME has a shape extended in a direction and is disposed in each of the sub-pixels SPXn. The electrodes RME may be extended in the first direction DR1 to be disposed across the emission area EMA and the subsidiary area SA of the sub-pixel SPXn, and they may be spaced apart from one another in the second direction DR2. The display device 10 may include a first electrode RME1 and a second electrode RME2 disposed on each of the sub-pixels SPXn. The first electrode RME1 is disposed on the left side of the center of the emission area EMA, and the second electrode RME2 is spaced apart from the first electrode RME1 in the second direction DR2 and is disposed on the right side of the emission area EMA.

A part of the first electrode RME1 may be disposed on the first protruding pattern BN1, and a part of the second electrode RME2 may be disposed on the second protruding pattern BN2. The electrodes RME may be disposed at least on the inclined side surfaces of the protruding patterns BN1 and BN2, respectively. According to an embodiment, the width of the electrodes RME measured in the second direction DR2 may be smaller than the width of the protruding patterns BN1 and BN2 measured in the second direction DR2. Each of the electrodes RME may be disposed to cover or overlap at least one side surface or a side surface of the respective protruding patterns BN to reflect light emitted from the light-emitting diodes ED. The distance between the electrodes RME spaced apart from each other in the second direction DR2 may be smaller than the distance between the protruding patterns BN1 and BN2. At least a part of each of the electrodes RME may be disposed on or directly disposed on the via layer VIA so that they may be disposed on the same plane and thus may be coplanar.

The first electrode RME1 and the second electrode RME2 may be connected to the third conductive layer through a first contact hole CTD and a second contact hole CTS, respectively, which are formed at such locations that they overlap the bank BNL. The first electrode RME1 may be in contact with the second electrode pattern CDP2 through the first contact hole CTD penetrating through the via layer VIA thereunder. The second electrode RME2 may be in contact with the second voltage line VL2 through the second contact hole CTS penetrating through the via layer VIA thereunder. The first electrode RME1 may be electrically connected to the first transistor T1 through the second electrode pattern CDP2 and the first electrode pattern CDP1 to receive the first supply voltage. The second electrode RME2 may be electrically connected to the second voltage line VL2 to receive the second supply voltage. Although the first contact hole CTD and the second contact hole CTS are formed under or below bank BNL in the drawings, the disclosure is not limited thereto. The contact holes CTD and CTS may be disposed either in the emission area EMA or in the subsidiary area SA.

The electrodes RME disposed in different sub-pixels SPXn adjacent to each other in the first direction DR1 may be spaced apart from each other at the separation region ROP in the subsidiary area SA. Such arrangement of the electrodes RME may be formed by forming single electrode lines extended in the first direction DR1 and disposing the light-emitting diodes ED thereon, and separating the electrode lines into parts during a subsequent process. The electrode lines may be used to generate an electric field in the sub-pixel SPXn to align the light-emitting diodes ED during the process of fabricating the display device 10.

After aligning the light-emitting diodes ED, the electrode lines are separated at the separation region ROP, such that the electrodes RME spaced apart from each other in the first direction DR1 may be formed. The process of separating the electrode lines may be carried out after the process of forming the second passivation layer PAS2 to be described later, and the second passivation layer PAS2 may not be disposed at the separation region ROP. The second passivation layer PAS2 may be utilized as a mask pattern in a process of separating the electrode lines.

The electrodes RME may be electrically connected to some of the light-emitting diodes ED. The electrodes RME may be connected to the light-emitting diodes ED through the connection electrodes CNE; CNE1 and CNE2 to be described below, and may transmit electric signals applied from a conductive layer thereunder to the light-emitting diodes ED.

Each of the electrodes RME may include a conductive material having a high reflectance. For example, the electrodes RME may include a metal such as silver (Ag), copper (Cu) and aluminum (Al) as the material having a high reflectance, and may be an alloy including aluminum (Al), nickel (Ni), lanthanum (La), etc. within the spirit and the scope of the disclosure.

The electrodes RME may reflect light that is emitted from the light-emitting diodes ED and travels toward the side surfaces of the protruding patterns BN toward the upper side of each of the sub-pixels SPXn.

It is, however, to be understood that the disclosure is not limited thereto. The electrodes RME may further include a transparent conductive material. For example, each of the electrodes RME may include a material such as ITO, IZO and ITZO. In an embodiment, each of the electrodes RME1 and RME2 may have a structure in which one or more layers of a transparent conductive material and one or more metal layers having high reflectivity may be stacked each other, or may be made up of a single layer including them. For example, each of the electrodes RME may have a stack structure such as ITO/Ag/ITO/, ITO/Ag/IZO, or ITO/Ag/ITZO/IZO.

The first passivation layer PAS1 is disposed on the via layer VIA, the protruding patterns BN, and the electrodes RME. The first passivation layer PAS1 may be disposed on the via layer VIA to cover or overlap the electrodes RME and the protruding patterns BN. The first passivation layer PAS1 may not be disposed at the separation region ROP in the subsidiary area where the electrodes RME adjacent to each other in the first direction DR1 are spaced apart from each other. The first passivation layer PAS1 can protect the electrodes RME and can insulate different electrodes RME from each other. The first passivation layer PAS1 can also prevent that the light-emitting diodes ED disposed thereon are brought into contact with the electrodes RME and damaged.

In an embodiment, the first passivation layer PAS1 may have steps so that a part of the upper surface is recessed between the electrodes RME spaced apart from one another in the second direction DR2. The light-emitting diodes ED may be disposed at the steps of the upper surface of the first passivation layer PAS1, and space may be formed between the light-emitting diodes ED and the first passivation layer PAS1.

The first passivation layer PAS1 may include contacts CT1 and CT2 exposing a part of the upper surface of each of the electrodes RME. The contacts CT1 and CT2 may penetrate through the first passivation layer PAS1, and the connection electrodes CNE described later may be in contact with the electrodes RME exposed through the contacts CT1 and CT2.

The bank BNL may be disposed on the first passivation layer PAS1. The bank BNL may be disposed in a lattice pattern including parts extended in the first direction DR1 and the second direction DR2 when viewed from the top, and may be disposed at the boundaries of the sub-pixels SPXn to distinguish the adjacent sub-pixels SPXn from each other. The bank BNL may be disposed to surround the emission area EMA and the subsidiary area SA, and the areas defined and opened by the bank BNL may be the emission area EMA and the subsidiary area SA, respectively.

The bank BNL may have a height, and in an embodiment, the height of the upper surface of the bank BNL may be higher than the protruding patterns BN, and its thickness may be equal to or greater than the protruding patterns BN. The bank BNL can prevent an ink from overflowing into adjacent sub-pixels SPXn during an inkjet printing process of the process of fabricating the display device 10. The bank BNL can separate the different sub-pixels SPXn from one another so that the ink in which different light-emitting diodes ED are dispersed are not mixed. The bank BNL may include, but is not limited to, polyimide, like the protruding patterns BN.

The light-emitting diodes ED may be disposed on the first passivation layer PAS1. The light-emitting diodes ED may include multiple layers disposed on the upper surface of the first substrate SUB in the direction parallel to it. The light-emitting diodes ED of the display device 10 may be arranged or disposed such that they are extended in parallel to the first substrate SUB. The multiple semiconductor layers included in the light-emitting elements 30 (or, light-emitting diodes ED) may be disposed sequentially in the direction parallel to the upper surface of the first substrate SUB. It is, however, to be understood that the disclosure is not limited thereto. In some implementations, in case that the light-emitting diodes ED have a different structure, layers may be disposed in a direction perpendicular to the first substrate SUB.

The light-emitting diodes ED may be disposed on the electrodes RME spaced apart from each other in the second direction DR2 between the different protruding patterns BN1 and BN2. The light-emitting diodes ED may be spaced apart from one another in the first direction DR1 in which the electrodes RME are extended, and may be aligned substantially parallel to one another. The light-emitting diodes ED may have a shape extended in a direction, and may have a length larger than the shortest distance between electrodes RME spaced apart from one another in the second direction DR2. At least one end or an end of each of the light-emitting diodes ED may be disposed on one of the different electrodes RME, or the both ends thereof may be disposed on the different electrodes RME, respectively. The direction in which the electrodes RME are extended may be substantially perpendicular to the direction in which the light-emitting diodes ED are extended. It is, however, to be understood that the disclosure is not limited thereto. The light-emitting diodes ED may be oriented obliquely to the direction in which the electrodes RME are extended.

The light-emitting diodes ED disposed in each of the sub-pixels SPXn may include semiconductor layers, and may emit light of different wavelength bands depending on the material of the semiconductor layers. It is, however, to be understood that the disclosure is not limited thereto. The light-emitting diodes ED disposed in each of the sub-pixels SPXn may include the semiconductor layers made of the same material or similar material and may emit light of the same color. The light-emitting diodes ED may include semiconductor layers doped with impurities of different conductivity types and may be aligned so that their ends are directed in an orientation depending on the electric field generated over the electrodes RME. A first end and a second end, which is the opposite end, of each of the light-emitting diodes ED may be defined with respect to one of the semiconductor layers. For example, a part of the light-emitting diode ED disposed on the first electrode RME1 may be the first end while a part of the light-emitting diode ED disposed on the second electrode RME2 may be the second end. In an embodiment in which the display device 10 may include a larger number of electrodes RME, the light-emitting diodes ED disposed on different electrodes RME may have first ends directed in different orientations.

Some of the light-emitting diodes ED may be in contact with the connection electrodes CNE: CNE1 and CNE2 so that they may be electrically connected. As a part of the semiconductor layer of each of the light-emitting diodes ED is exposed at the end surface on one side or a side of the direction in which they are extended, the exposed part of the semiconductor layer may be in contact with the connection electrodes CNE. Each of the light-emitting diodes ED may be electrically connected to the electrodes RME and the conductive layers under or below the via layer VIA through the connection electrodes CNE, and an electric signal may be applied to it so that light of a given or selected wavelength range can be emitted.

The second passivation layer PAS2 may be disposed on the light-emitting diodes ED. The second passivation layer PAS2 may be extended in the first direction DR1 and may partially surround the outer surfaces of the light-emitting diodes ED between the first protruding pattern BN1 and the second protruding pattern BN2 while not covering or overlapping the both sides or both ends of the light-emitting diodes ED. The second passivation layer PAS2 may form a linear or island pattern in each sub-pixel SPXn when viewed from the top. The second passivation layer PAS2 can protect the light-emitting diodes ED and fix the light-emitting diodes ED during the process of fabricating the display device 10. The second passivation layer PAS2 may be disposed to fill the space between light-emitting diodes ED and the first passivation layer PAS1 thereunder.

As will be described later, the second passivation layer PAS2 may also be partially disposed on the protruding patterns BN1 and BN2, the bank BNL, and the subsidiary area SA. The second passivation layer PAS2 may include portions covering or overlapping the light-emitting diodes ED, and portions connected thereto and disposed on the protruding patterns BN1 and BN2, the bank BNL and the subsidiary area SA. More detailed description thereon will be given with reference to an embodiment.

The connection electrodes CNE; CNE1 and CNE2 may be disposed on the electrodes RME and the light-emitting diodes ED. The connection electrodes CNE may be disposed partially on the side surfaces of the pattern portions of the second passivation layer PAS2, and may be spaced apart from the other connection electrodes CNE in the second direction DR2 with the pattern portions therebetween. The parts of the connection electrodes CNE disposed on the side surfaces of the pattern portions of the second passivation layer PAS2 may be lower than t the pattern portions, and thus the connection electrodes CNE may not be disposed on the top of the second passivation layer PAS2. According to an embodiment, the connection electrodes CNE may not overlap the second passivation layer PAS2 in the thickness direction. By performing a process of removing the material of the connection electrodes disposed on the second passivation layer PAS2, a first connection electrode CNE1 and a second connection electrode CNE2 spaced apart from each other may be formed. The connection electrodes CNE may not be disposed on the second passivation layer PAS2.

The connection electrodes CNE may be in contact with the light-emitting diodes ED and the electrodes RME. The connection electrodes CNE may be in direct contact with the semiconductor layer exposed at the both end surfaces of the light-emitting diodes ED, and may be in contact with at least one of the electrodes RME through the contacts CT1 and CT2 penetrating through the first passivation layer PAS1. The both ends of the light-emitting diodes ED may be electrically connected to the electrodes RME through the connection electrodes CNE1 and CNE2. It is to be noted that the semiconductor layer may not necessarily be disposed on both sides of the light-emitting diodes ED. An electrode layer other than the semiconductor layer may be disposed on at least one side or a side of the light-emitting diodes ED. The electrode layer of the light-emitting diodes ED may be connected to the connection electrodes CNE1 and CNE2.

The first connection electrode CNE1 may have a shape extended in the first direction DR1 and may be disposed on the first electrode RME1. A part of the first connection electrode CNE1 disposed on the first protruding pattern BN1 may overlap the first electrode RME1 and may be extended in the first direction DR1 from it to the subsidiary area SA beyond the bank BNL. The first connection electrode CNE1 may include an expanded portion having a large width in the second direction DR2 in the subsidiary area SA, and the expanded portion may be in contact with the first electrode RME1 through the first contact CT1 exposing the upper surface of the first electrode RME1. The first connection electrode CNE1 may be in contact with the first ends of the light-emitting diodes ED and the first electrode RME1 to transmit an electric signal applied from the first transistor Ti to the light-emitting diodes ED.

The second connection electrode CNE2 may have a shape extended in the first direction DR1 and may be disposed on the second electrode RME2. A part of the second connection electrode CNE2 disposed on the second protruding pattern BN2 may overlap the second electrode RME2 and may be extended in the first direction DR1 from it to the subsidiary area SA beyond the bank BNL. The second connection electrode CNE2 may include an expanded portion having a large width in the second direction DR2 in the subsidiary area SA, and the expanded portion may be in contact with the second electrode RME2 through the second contact CT2 exposing the upper surface of the second electrode RME2. The second connection electrode CNE2 may be in contact with the second ends of the light-emitting diodes ED and the second electrode RME2 to transmit an electric signal applied from the second voltage line VL2 to the light-emitting diodes ED.

The first connection electrode CNE1 and the second connection electrode CNE2 may be spaced apart from each other in the second direction DR2 when viewed from the top. The first connection electrode CNE1 and the second connection electrode CNE2 may be disposed so that they are not in contact with each other, and an electric signal applied to each of the connection electrodes CNE may flow through the light-emitting diodes ED. It is to be noted that the first connection electrode CNE1 and the second connection electrode CNE2 may be disposed on substantially the same layer or a same layer. It is, however, to be understood that the disclosure is not limited thereto. In an embodiment, the first connection electrode CNE1 and the second connection electrode CNE2 may be disposed on different layers, and another insulating layer may be further disposed between them.

According to an embodiment, the connection electrodes CNE may include main portions CMP1 and CMP2 and subsidiary portions CSP1 and CSP2 having different widths measured in the second direction DR2. The first connection electrode CNE1 may include a first main portion CMP1 and first subsidiary portions CSP1 connected thereto and having a width smaller than that of the first main portion CMP1. The second connection electrode CNE2 may include a second main portion CMP2 and second subsidiary portions CSP2 connected thereto and having a width smaller than that of the second main portion CMP2. The portion of the first connection electrode CNE1 that is disposed in the emission area EMA and has a larger width is the first main portion CMP1. The first subsidiary portions CSP1 may be connected to the both sides of the first main portion CMP1 in the first direction DR1, respectively. The portion of the second connection electrode CNE2 that is disposed in the emission area EMA and has a larger width is the second main portion CMP2. The second subsidiary portions CSP2 may be connected to the both sides of the second main portion CMP2 in the first direction DR1, respectively. Among the subsidiary portions CSP1 and CSP2 of each of the connection electrodes CNE, the subsidiary portions CSP1 and CSP2 connected to the upper side of the main portions CMP1 and CMP2, respectively, may be disposed in the emission area EMA, and the subsidiary portions CSP1 and CSP2 connected to the lower side of the main portions CMP1 and CMP2, respectively, may be extended in the first direction DR1 to be disposed in the subsidiary area SA beyond the bank BNL.

The first main portion CMP1 and the second main portion CMP2 may be spaced apart from each other and face each other in the second direction DR2. The first subsidiary portions CSP1 and the second subsidiary portions CSP2 may be spaced apart from each other and face each other in the second direction DR2 as well. The sides of the first main portion CMP1 and the second main portion CMP2, which are opposite to the sides facing each other, may be aligned with the sides of the first subsidiary portions CSP1 and the second subsidiary portions CSP2, respectively. As the first main portion CMP1 and the second main portion CMP2 have a larger width than the first subsidiary portions CSP1 and the second subsidiary portions CSP2, the distance between the first main portion CMP1 and the second main portion CMP2 may be different from the distance between the first subsidiary portions CSP1 and the second subsidiary portions CSP2.

According to an embodiment, the distance W1 between the main portions CMP1 and CMP2 of the connection electrodes CNE in the second direction DR2 may be smaller than the distance W2 between the subsidiary portions CSP1 and CSP2 in the second direction DR2. The first connection electrode CNE1 and the second connection electrode CNE2 may be spaced apart from each other in the second direction DR2 with the second passivation layer PAS2 interposed therebetween, and the first main portion CMP1 and the second main portion CMP2 may be in contact with the side surfaces of the second passivation layer PAS2, respectively. The first distance W1 between the first main portion CMP1 and the second main portion CMP2 may be equal to the width of the pattern portions of the second passivation layer PAS2 disposed on the light-emitting diodes ED.

The connection electrodes CNE spaced apart from each other in the second direction DR2 and facing each other may be arranged or disposed such that they are equally spaced apart from each other with respect to an imaginary line extended in the first direction DR1. For example, each of the connection electrodes CNE and the electrodes RME may be equally spaced apart from one another with respect to the same imaginary line. For example, the first electrode RME1 and the second electrode RME2 may be equally spaced apart from each other in the second direction DR2 with respect to an imaginary line extended in the first direction DR1, and the first connection electrode CNE1 and the second electrode CNE2 may be equally spaced apart from each other in the second direction DR2 with respect to the imaginary line. It is to be noted that the distance between the electrodes RME and the imaginary line may be different from the distance between the connection electrodes CNE and the imaginary line. The distance W3 between the first electrode RME1 and the second electrode RME2 may be greater than the first distance W1 between the first connection electrode CNE1 and the second connection electrode CNE2. The third distance W3 between the electrodes RME1 and RME2 may be constant in the light-emitting area ELA, while the distance between the connection electrodes CNE1 and CNE2 may change between the first distance W1 and the second distance W2 in the light-emitting area ELA. The light-emitting diodes ED may be disposed so that their both ends are placed on the first electrode RME1 and the second electrode RME2, respectively. The light-emitting diodes ED may be arranged or disposed in the first direction DR1 along the imaginary line by which the different electrodes RME are equally spaced apart from each other. The relative arrangement of the electrodes RME, the light-emitting diodes ED and the connection electrodes CNE may be determined based on the distance from the imaginary line, the width or the length of the elements.

According to an embodiment, the length LD of the light-emitting diodes ED in a direction may be greater than the third distance W3 between the first electrode RME1 and the second electrode RME2. In an embodiment, an ink in which the light-emitting diodes ED are dispersed may be ejected onto the emission area EMA. The light-emitting diodes ED may be aligned on the electrodes RME as their orientations and locations are changed by the force of an electric field generated over the electrodes RME. As light-emitting diodes ED has the length LD that is larger than the third distance W3 between the electrodes RME, most of the light-emitting diodes ED may have the both ends disposed on the first electrode RME1 and the second electrode RME2, respectively.

The pattern portions of the second passivation layer PAS2 disposed on the light-emitting diodes ED may also be extended in the first direction DR1 along the imaginary line. According to an embodiment, the width of the pattern portion of the second passivation layer PAS2 measured in the second direction DR2 may be smaller than the length LD of the light-emitting diodes ED. The second passivation layer PAS2 may be disposed so as not to cover or overlap the both ends of the light-emitting diodes ED.

The connection electrodes CNE disposed on the electrodes RME may or may not be in contact with the both ends of the light-emitting diodes ED depending on the distance from the imaginary line or the distances W1 and W2. According to an embodiment, the first distance W1 between the main portions CMP1 and CMP2 of the connection electrodes CNE may be smaller than the length LD of the light-emitting diodes ED in the second direction DR2. The second distance W2 between the subsidiary portions CSP1 and CSP2 may be greater than the length LD of the light-emitting diodes ED. The light-emitting diodes ED may be sorted into first-type light-emitting diodes ED #1 having both ends in contact with the main portions CMP1 and CMP2 of the connection electrodes CNE, and second-type light-emitting diodes ED #2 having at least one end or an end not in contact with the connection electrodes CNE but being spaced apart from the subsidiary portions CSP1 and CSP2.

The first ends of the first-type light-emitting diodes ED #1 may be in contact with the first main portion CMP1 of the first connection electrode CNE1 while the second ends thereof may be in contact with the second main portion CMP2 of the second connection electrode CNE2. The main portions CMP1 and CMP2 may have a width greater than that of the subsidiary portions CSP1 and CSP2, and the first distance W1 between them may be less than the length LD of the light-emitting diodes ED. As a result, the main portions CMP1 and CMP2 may be in contact with the light-emitting diodes ED since the distance between them is smaller than the length LD of the light-emitting diodes ED. As the first-type light-emitting diodes ED #1 may have the both ends in contact with the connection electrodes CNE, respectively, electric signals flowing to the electrodes RME can be applied thereto, so that light can be emitted by the electric signal (hereinafter referred to as connected light-emitting diodes).

On the other hand, the second distance W2 between the subsidiary portions CSP1 and CSP2 may be greater than the length LD of the light-emitting diodes ED. The second-type light-emitting diodes ED #2 having the both ends spaced apart from the first subsidiary portions CSP1 and the second subsidiary portions CSP2, respectively, may not be in contact with the connection electrodes CNE, unlike the first-type light-emitting diodes ED #1. The second-type light-emitting diodes ED #2 may be non-connected light-emitting diodes to which electric signals flowing to the electrodes RME are not applied. The first-type light-emitting diodes ED #1 may be disposed between the second-type light-emitting diodes ED #2.

As described above, the ink in which light-emitting diodes ED are dispersed may be ejected onto the emission area EMA surrounded by the bank BNL, and may be aligned by an electric field generated over the electrodes RME. In case that the ink is ejected onto the emission area EMA, the volume may be different across different locations according to the shape of the ink. As a result, the number of light-emitting diodes ED dispersed in the ink may vary depending on the volume of the ink. In the emission area EMA, the number of light-emitting diodes ED may not be uniform at the outer portions of the ink on the upper and lower sides of the emission area EMA adjacent to the bank BNL, depending on the volume of the ink. As the second passivation layer PAS2 is extended in the first direction DR1 between the electrodes RME to cover or overlap the light-emitting diodes ED, most of the light-emitting diodes ED may have their both ends exposed and fixed by the second passivation layer PAS2. If the number of light-emitting diodes ED aligned in each of the sub-pixels SPXn is not uniform and all of the light-emitting diodes ED aligned on the electrodes RME in each emission area EMA are connected, different sub-pixels SPXn may have different luminances.

In view of the above, by selectively connecting the electrodes RME with only the light-emitting diodes ED disposed at a designated location in the emission area EMA of the display device 10, it is possible to reduce differences in the luminance. For example, it is possible to reduce differences in the luminance between the sub-pixels SPXn by way of designating a location where the volume of the ink is uniform and thus the number of the light-emitting diodes ED can be controlled, and by connecting only the light-emitting diodes ED disposed in the location.

In the display device 10 according to an embodiment, only the light-emitting diodes ED disposed in a designated location can be electrically connected to the electrodes RME by utilizing the connection electrodes CNE in direct contact with the light-emitting diodes ED. The connection electrodes CNE include the main portions CMP1 and CMP2 and subsidiary portions CSP1 and CSP2 having different distances from the other connection electrodes CNE that they are spaced apart from and face them in the second direction DR2. The connection electrodes CNE may electrically connect only some or a number of the light-emitting diodes ED arranged or disposed on the electrodes RME that are disposed in some or a number of areas with the electrodes RME. Among the light-emitting diodes ED, the first-type light-emitting diodes ED #1 may have their both ends in contact with the main portions CMP1 and CMP2, respectively. The first-type light-emitting diodes ED #1 may be disposed in the light-emitting area ELA of the emission area EMA and electrically connected to the electrodes RME, to emit light of a wavelength range. On the contrary, the second-type light-emitting diodes ED #2 may have their both ends spaced apart from the subsidiary portions CSP1 and CSP2, respectively, or may have only one end or an end connected to the connection electrodes CNE. The second-type light-emitting diodes ED #2 may be disposed in the non-light-emitting area ELA of the emission area EMA and electrically connected to none of the electrodes RME, to emit no light. It is to be noted that the first-type light-emitting diodes ED #1 and the second-type light-emitting diodes ED #2 may be fixed by the pattern portions of the second passivation layer PAS2. The length of the pattern portions of the second passivation layer PAS2 may be greater than the width of the light-emitting area ELA in the first direction DR1.

The emission area EMA of each of the sub-pixels SPXn may include the light-emitting area ELA in which the first-type light-emitting diodes ED #1 are disposed, and non-light-emitting areas NEA1 and NEA2 in which the second-type light-emitting diodes ED #2 are disposed. The light-emitting area ELA is a portion in which the main portions CMP1 and CMP2 of the connection electrodes CNE are disposed, and may be located or disposed at the middle of the emission area EMA together with the first-type light-emitting diodes ED #1. The light-emitting area ELA may be formed to be spaced apart in the first direction DR1 from the portions of the bank BNL extended in the second direction DR2. The first non-light-emitting area NEA1 may be located or disposed on the upper side of the light-emitting area ELA in the first direction DR1, and the second non-light-emitting area NEA2 may be located or disposed on the lower side of the light-emitting area ELA in the first direction DR1. The non-light-emitting areas NEA1 and NEA2 are portions in which the subsidiary portions CSP1 and CSP2 of the connection electrodes CNE are disposed, and may be located or disposed at the upper and lower sides of the emission area EMA together with the second-type light-emitting diodes ED #2. The non-light-emitting areas NEA1 and NEA2 may be adjacent to the portions of the bank BNL extended in the second direction DR2.

Although neither of the both ends of the second-type light-emitting diodes ED #2 is in contact with the connection electrodes CNE in the example shown in FIG. 7, but the disclosure is not limited thereto. As described above, the electrodes RME and the connection electrodes CNE are disposed so that they are spaced apart by distances from the same imaginary line extended in the first direction DR1. However, if a mask for forming patterns is misaligned during the process of forming the connection electrodes CNE, the connection electrodes CNE may be shifted in a direction. Even if the connection electrodes CNE are shifted, as the distance W2 between the subsidiary portions CSP1 and CSP2 of the connection electrodes CNE is larger than the length LD of the light-emitting diodes ED, the second-type light-emitting diodes ED #2 can still remain as non-connected light-emitting diodes.

Figure 8:
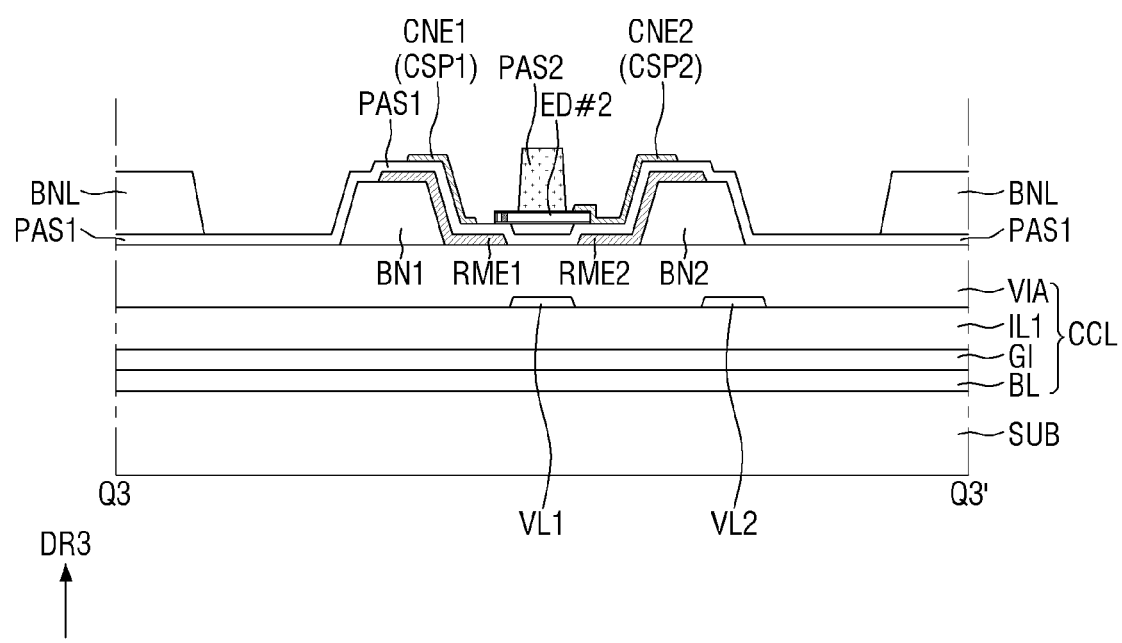
FIG. 8 is a schematic cross-sectional view showing a portion of a display device according to an embodiment where a second light-emitting diode is disposed.

FIG. 8 is a schematic cross-sectional view showing a portion of a display device according to an embodiment where a second light-emitting diode is disposed.

Referring further to FIG. 8, in some implementations, the first end of the second-type light-emitting diode ED #2 may be spaced apart from the first connection electrode CNE1 while the second end thereof may be in contact with the second connection electrode CNE2. If the connection electrodes CNE are shifted to the left side in the second direction DR2, the second end, which is the right end of the second-type light-emitting diode ED #2, may be in contact with the second subsidiary portion CSP2 of the second connection electrode CNE2. In case that this happens, the first end, which is the left end of the second-type light-emitting diode ED #2, may not be in contact with the first subsidiary portions CSP1 but may be spaced apart from it since the distance W2 between the first subsidiary portion CSP1 of the first connection electrode CNE1 and the second subsidiary portion CSP2 of the second connection electrode CNE2 is greater than the length LD of the light-emitting diode ED. Accordingly, even if the connection electrodes CNE are shifted to one side or a side or the opposite side or another side in the second direction DR2, the second-type light-emitting diode ED #2 can still remain as a non-connected light-emitting diode.

Referring back to FIGS. 3 to 7, according to an embodiment, the connection electrodes CNE may include electrode contact portions CTP1 and CTP2 that are connected to the subsidiary portions CSP1 and CSP2, respectively, and have a width measured in the second direction DR2 that is larger than that of the subsidiary portions CSP1 and CSP2. The first electrode contact portion CTP1 of the first connection electrode CNE1 may be in contact with the first electrode RME1 through the first contact CT1, and the second electrode contact portion CTP2 of the second connection electrode CNE2 may be in contact with the second electrode RME2 through the second contact CT2.

According to an embodiment, the contacts CT1 and CT2 may be spaced apart from the area where the light-emitting diodes ED is disposed in the first direction DR1 so that they do not overlap the light-emitting diodes ED in the second direction DR2. Although the contacts CT1 and CT2 are formed in the subsidiary area SA in the drawings, the disclosure is not limited thereto. The contacts CT1 and CT2 may be formed in a part of the emission area EMA where the light-emitting diodes ED are not disposed.

The connection electrodes CNE may include a conductive material. For example, the connection electrodes CNE may include ITO, IZO, ITZO, aluminum (Al), etc. within the spirit and the scope of the disclosure.

For example, the connection electrodes CNE may include a transparent conductive material, and light emitted from the light-emitting diodes ED may transmit the connection electrodes CNE to proceed toward the electrodes RME. It is, however, to be understood that the disclosure is not limited thereto.

Although not shown in the drawings, another insulating layer may be further disposed on the second passivation layer PAS2, and the connection electrodes CNE. The insulating layer may protect the elements disposed thereon against the external environment.

The above-described first passivation layer PAS1 may include an inorganic insulating material or an organic insulating material, and the second passivation layer PAS2 may include an organic insulating material. It is, however, to be understood that the disclosure is not limited thereto.

According to an embodiment, the connection electrodes CNE of the display device 10 may include the main portions CMP1 and CMP2 and the subsidiary portions CSP1 and CSP2 that have different widths and have different distances from the other connection electrodes CNE. The light-emitting diodes ED arranged or disposed on the electrodes RME may be sorted into the connected light-emitting diodes and the non-connected light-emitting diodes depending on the relative arrangement with the main portions CMP1 and CMP2 or the subsidiary portions CSP1 and CSP2 of the connection electrodes CNE. The emission area EMA of each of the sub-pixels SPXn may include a light-emitting area ELA and non-light-emitting areas NEA1 and NEA2. As the connection electrodes CNE of the display device 10 have such a shape, an area of each of the sub-pixels SPXn can be designated as the light-emitting area ELA, and a uniform number of light-emitting diodes ED can be disposed in the light-emitting area ELA in each of the sub-pixels SPXn. In this manner, it is possible to reduce differences in the luminance between the sub-pixels SPXn in the display device 10 according to an embodiment.

Figure 9:
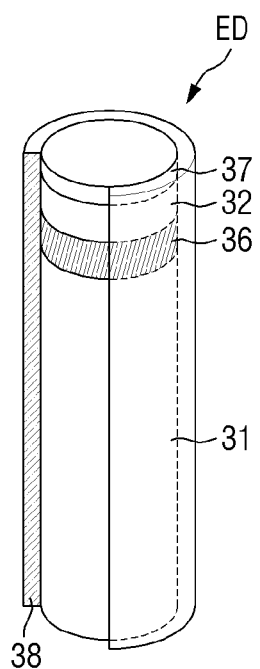
FIG. 9 is a view showing a light-emitting element according to an embodiment.

FIG. 9 is a view showing a light-emitting element according to an embodiment.

Referring to FIG. 9, a light-emitting element ED may be a light-emitting diode. For example, the light-emitting element ED may have a size from nanometers to micrometers and may be an inorganic light-emitting diode made of an inorganic material. The light-emitting diode ED may be aligned between two electrodes facing each other as polarities are created by forming an electric field in a direction between the two electrodes.

The light-emitting diode ED according to an embodiment may have a shape extended in one direction or a direction. The light-emitting element ED may have a shape substantially of a cylinder, a rod, a wire, a tube, etc. within the spirit and the scope of the disclosure.

It is to be understood that the shape of the light-emitting diode ED is not limited thereto. The light-emitting diode ED may have a variety of shapes including a substantially polygonal column shape such as substantially a cube, substantially a cuboid and a substantially hexagonal column, or a shape that is extended in a direction with partially inclined outer surfaces.

The light-emitting diode ED may include semiconductor layers doped with impurities of a conductive type (for example, p-type or n-type). The semiconductor layers may emit light of a wavelength band by transmitting an electric signal applied from an external power source. The light-emitting diode ED may include a first semiconductor layer 31, a second semiconductor layer 32, an emissive layer 36, an electrode layer 37, and an insulating film 38.

The first semiconductor layer 31 may be an n-type semiconductor. The second semiconductor layer 31 may include a semiconductor material having the following chemical formula: $Al_xGa_yIn_{1-x-y}N$ ($0 \leq x \leq 1$, $0 \leq y \leq 1$, $0 \leq x+y \leq 1$). For example, the first semiconductor layer 31 may be one or more of n-type doped AlGaInN, GaN, AlGaN, InGaN, AlN and InN. The n-type dopant doped into the first semiconductor layer 31 may be Si, Ge, Sn, etc. within the spirit and the scope of the disclosure.

The second semiconductor layer 32 is disposed above the first semiconductor layer 31 with the emissive layer 36 therebetween. The second semiconductor layer 32 may be a p-type semiconductor, and may include a semiconductor material having the following chemical formula: $Al_xGa_yIn_{1-x-y}N$ ($0 \leq x \leq 1$, $0 \leq y \leq 1$, $0 \leq x+y \leq 1$). For example, the second semiconductor layer 32 may be one or more of p-type doped AlGaInN, GaN, AlGaN, InGaN, AlN and InN. The p-type dopant doped into the second semiconductor layer 32 may be Mg, Zn, Ca, Se, Ba, etc. within the spirit and the scope of the disclosure.

Although each of the first semiconductor layer 31 and the second semiconductor layer 32 is implemented as a signal layer in the drawings, the disclosure is not limited thereto. Depending on the material of the emissive layer 36, the first semiconductor layer 31 and the second semiconductor layer 32 may further include a larger number of layers, for example, a clad layer or a tensile strain barrier reducing (TSBR) layer.

The emissive layer 36 is disposed between the first semiconductor layer 31 and the second semiconductor layer 32. The emissive layer 36 may include a material having a single or multiple quantum well structure. In case that the emissive layer 36 may include a material having the multiple quantum well structure, the structure may include quantum layers and well layers alternately stacked each other. The emissive layer 36 may emit light as electron-hole pairs are combined therein in response to an electrical signal applied through the first semiconductor layer 31 and the second semiconductor layer 32. The emissive layer 36 may include a material such as AlGaN and AlGaInN. In case that the emissive layer 36 has a multi-quantum well structure in which quantum layers and well layers may be alternately stacked each other, the quantum layers may include AlGaN or AlGaInN, and the well layers may include a material such as GaN and AlGaN.

The emissive layer 36 may have a structure in which a semiconductor material having a large band gap energy and a semiconductor material having a small band gap energy may be alternately stacked each other, and may include other Group III to Group V semiconductor materials depending on the wavelength range of the emitted light. Accordingly, the light emitted from the emissive layer 36 is not limited to the light of the blue wavelength band. The emissive layer 36 may emit light of red or green wavelength band in some implementations.

The electrode layer 37 may be an ohmic connection electrode. It is, however, to be understood that the disclosure is not limited thereto. The electrode layer 37 may be a Schottky connection electrode. The light-emitting diode ED may include at least one electrode layer 37. The light-emitting diode ED may include one or more electrode layers 37. It is, however, to be understood that the disclosure is not limited thereto. The electrode layer 37 may be eliminated.

The electrode layer 37 can reduce the resistance between the light-emitting element ED and the electrodes or the connection electrodes in case that the light-emitting element ED is electrically connected to the electrodes or the connection electrodes in the display device 10. The electrode layer 37 may include a metal having conductivity. For example, the electrode layer 37 may include at least one of aluminum (Al), titanium (Ti), indium (In), gold (Au), silver (Ag), ITO, IZO and ITZO.

The insulating film 38 may be disposed to surround the outer surfaces of the semiconductor layers and electrode layers described above. For example, the insulating film 38 may be disposed to surround at least the outer surface of the emissive layer 36, with both ends of the light-emitting element ED in the longitudinal direction exposed. A part of the upper surface of the insulating film 38 may be rounded in cross section, which is adjacent to at least one of the ends of the light-emitting diode ED.

The insulating film 38 may include materials having insulating properties such as silicon oxide ($SiO_x$), silicon nitride ($SiN_x$), silicon oxynitride ($SiO_xN_y$), aluminum nitride ($AlN_x$) and aluminum oxide ($AlO_x$). Although the insulating film 38 is formed as a single layer in the drawings, the disclosure is not limited thereto. In an embodiment, the insulating film 38 may be made up of a multilayer structure in which multiple layers may be stacked each other.

The insulating film 38 can protect the above-described elements. The insulating film 38 can prevent an electrical short-circuit that may occur in the emissive layer 36 if it comes in direct contact with an electrode through which an electric signal is transmitted to the light-emitting diode ED. The insulating film 38 can prevent a decrease in luminous efficiency.

The outer surface of the insulating film 38 may be subjected to surface treatment. The light-emitting diodes ED may be dispersed in an ink, and the ink may be sprayed onto the electrode. In doing so, a surface treatment may be applied to the insulating film 38 so that it becomes hydrophobic or hydrophilic in order to keep the light-emitting diodes ED dispersed in the ink from being aggregated with one another.

Hereinafter, display devices according to a variety of embodiments will be described with reference to other drawings.

Figure 10:
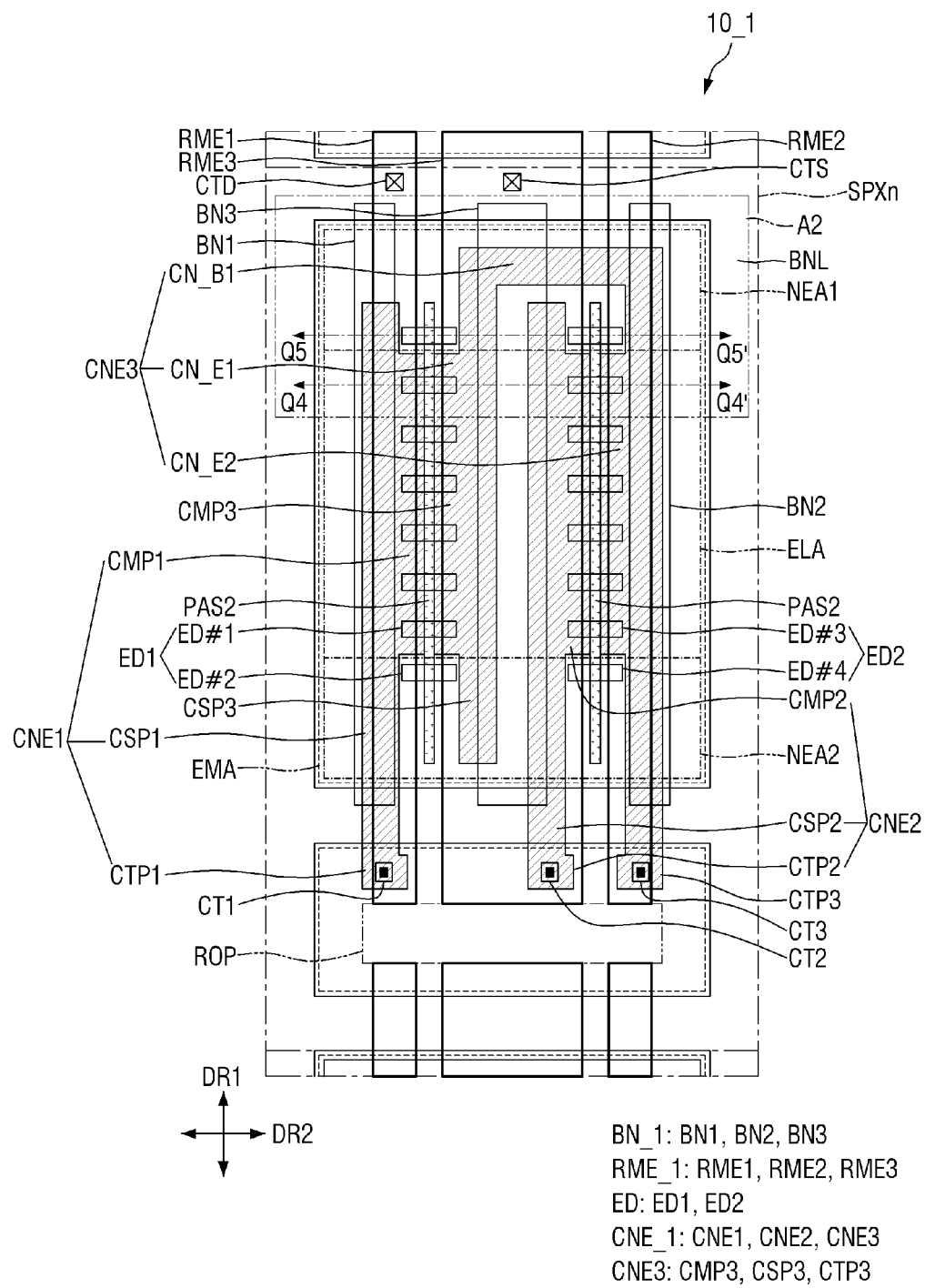
FIG. 10 is a schematic plan view showing a sub-pixel of a display device according to an embodiment.
Figure 11:
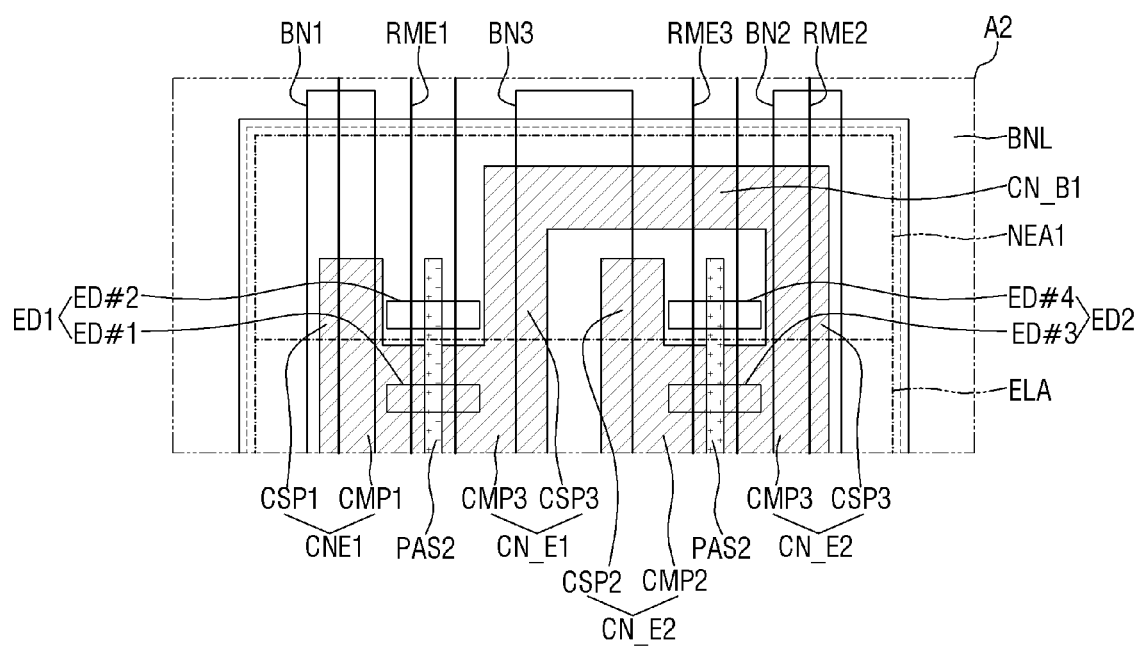
FIG. 11 is an enlarged view of portion A2 of FIG. 10.
Figure 12:
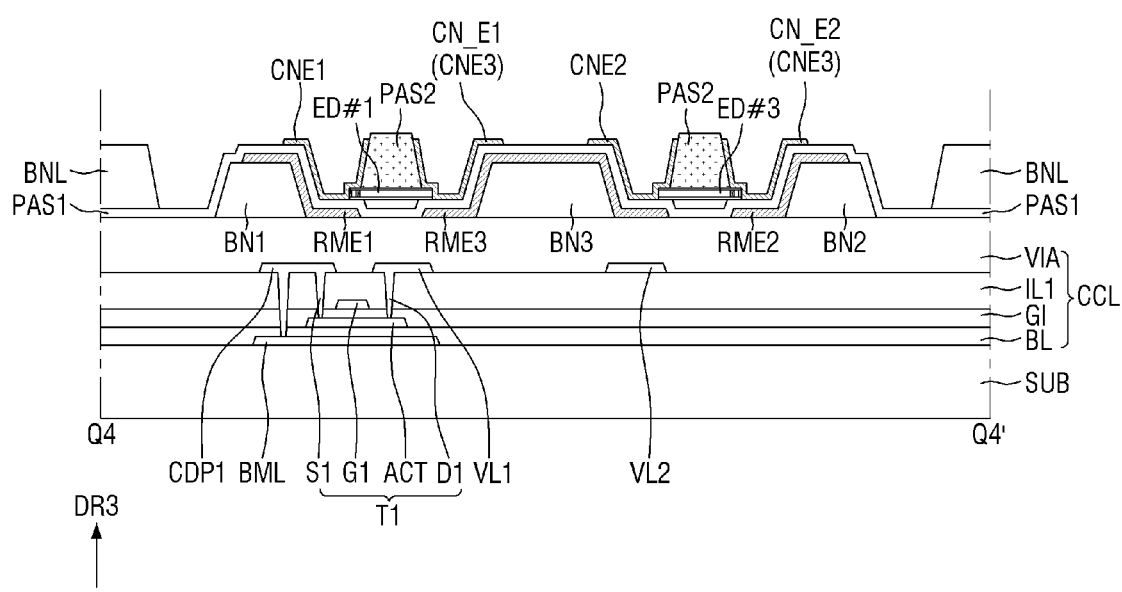
FIG. 12 is a schematic cross-sectional view taken along line Q4-Q4' of FIG. 10.
Figure 13:
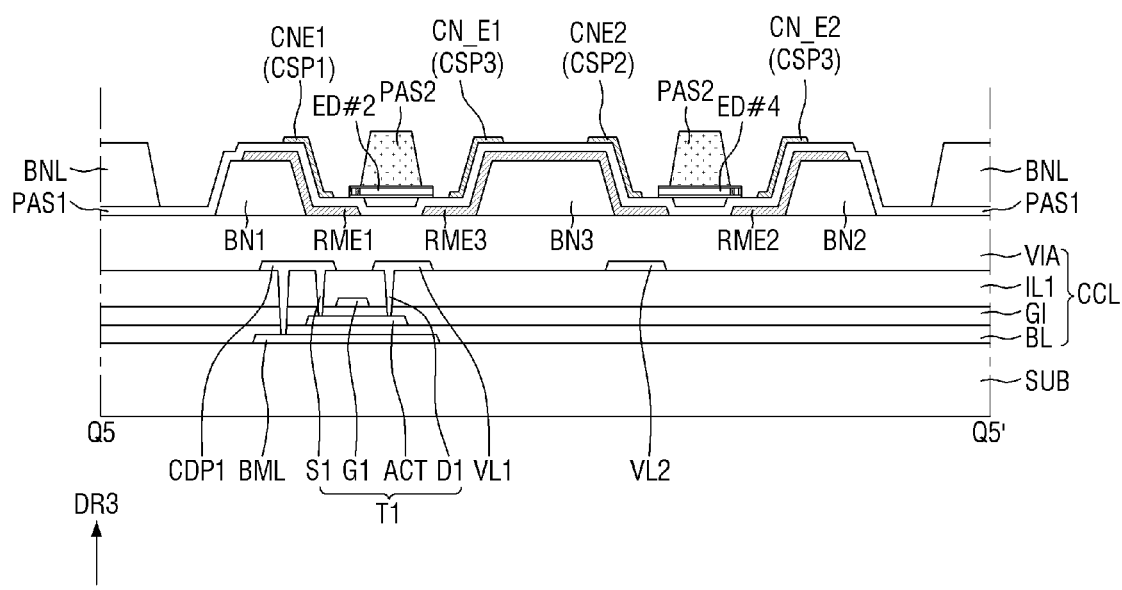
FIG. 13 is a schematic cross-sectional view taken along line Q5-Q5' of FIG. 10.

FIG. 10 is a schematic plan view showing a sub-pixel of a display device according to an embodiment. FIG. 11 is an enlarged view of portion A2 of FIG. 10. FIG. 12 is a schematic cross-sectional view taken along line Q4-Q4' of FIG. 10. FIG. 13 is a schematic cross-sectional view taken along line Q5-Q5' of FIG. 10. FIG. 12 shows a cross section passing through both ends of each of a first-type light-emitting diode ED #1 and a third light-emitting diode ED #3, which are connected light-emitting diodes. FIG. 13 shows a cross section passing through both ends of each of a second-type light-emitting diode ED #2 and a fourth light-emitting diode ED #4, which are non-connected light-emitting diodes.

Referring to FIGS. 10 to 13, a display device 10_1 according to an embodiment may include a greater number of electrodes RME_1 for each of the sub-pixels SPXn, and the number of light-emitting diodes ED disposed in each of the sub-pixels SPXn may increase. Accordingly, a greater number of the connection electrodes CNE_1 including main portions CMP1, CMP2 and CMP3 and subsidiary portions CSP1, CSP2 and CSP3 may be disposed.

For example, the protrusion patterns BN_1 may further include a third protrusion pattern BN3 having a width different from the first protrusion pattern BN1 and the second protrusion pattern BN2 in addition to the first protrusion pattern BN1 and the second protrusion pattern BN2. The third protruding pattern BN3 may be disposed between the first protruding pattern BN1 and the second protruding pattern BN2 and may have a shape extended in the first direction DR1. The first protruding pattern BN1, the second protruding pattern BN2 and the third protruding pattern BN3 may have the same length extended in the first direction DR1, but may have a larger width measured in the second direction DR2 than the widths of the other protruding patterns.

The third protruding pattern BN3 may be spaced apart from the first and second protruding patterns BN1 and BN2 in the second direction DR2. The third protruding pattern BN3 may have a larger width than the first protruding pattern BN1 so that a third electrode RME3 to be described later may be disposed. The light-emitting diodes ED may be disposed between the first protruding pattern BN1 and the third protruding pattern BN3, and between the second protruding pattern BN2 and the third protruding pattern BN3.

The first electrode RME1 may be disposed on the first protruding pattern BN1, and the second electrode RME2 may be disposed on the second protruding pattern BN2. Detailed descriptions thereon have been given above with reference to FIGS. 2 and 3.

The third electrode RME3 is disposed on the third protruding pattern BN3. The third electrode RME3 may be extended in the first direction DR1 between the first electrode RME1 and the second electrode RME2 and may be disposed across the emission area EMA and the subsidiary area SA. In an embodiment, the width of the third electrode RME3 may be greater than the width of the first electrode RME1 and the second electrode RME2 and greater than the width of the third protruding pattern BN3. The third electrode RME3 may be disposed to cover or overlap both side surfaces of the third protruding pattern BN3, and may be spaced apart from and face the first electrode RME1 and the second electrode RME2 in the second direction DR2.

Similar to the first electrode RME1, the third electrode RME3 may be connected to the third conductive layer under or below the via layer VIA. The third electrode RME3 may be connected to the second voltage line VL2 through the second contact hole CTS formed at such a location that it overlaps the bank BNL in the thickness direction. Accordingly, unlike the first electrode RME1 and the third electrode RME3, the second electrode RME2 may not be connected to the third conductive layer. The second electrode RME2 may be connected to the second connection electrode CNE2, and an electric signal flowing along the light-emitting diodes ED may be applied thereto. As will be described later, the second electrode RME2 may provide an electrical connection path for different light-emitting diodes ED together with the second connection electrode CNE2.

The light-emitting diodes ED may be disposed between the first protruding pattern BN1 and the third protruding pattern BN3, and between the third protruding pattern BN3 and the second protruding pattern BN2. The first light-emitting diodes ED1 disposed between the first and third protruding patterns BN1 and BN3 may have first ends disposed on the first electrode RME1 and second ends disposed on one side or a side of the third electrode RME3. The second light-emitting diodes ED2 disposed between the third and second protruding patterns BN3 and BN2 may have first ends disposed on the second electrode RME2 and second ends disposed on the opposite side of the third electrode RME3. According to an embodiment, the first ends of the first light-emitting diode ED1 may face in the opposite direction to the first ends of the second light-emitting diode ED2.

The second passivation layer PAS2 may include pattern portions disposed on the light-emitting diodes ED between the protruding patterns BN1, BN2 and BN3. The pattern portions of the second passivation layer PAS2 may be extended in the first direction DR1 to cover or overlap the first light-emitting diodes ED1 and second light-emitting diodes ED2. These may surround and fix the light-emitting diodes ED.

The connection electrodes CNE_1 may include a first connection electrode CNE1 disposed on the first electrode RME1, a second connection electrode CNE2 disposed on the opposite side of the third electrode RME3, and a third connection electrode CNE3 disposed on the side of the third electrode RME3 and the second electrode RME2.

The first connection electrode CNE1 may be in contact with the first electrode RME1 and first ends of some or a number of the first light-emitting diodes ED1. The first connection electrode CNE1 may be in contact with the first electrode RME1 through the first contact CT1 penetrating the first passivation layer PAS1. The second connection electrode CNE2 may be in contact with the third electrode RME3 and second ends of some or a number of the second light-emitting diodes ED2. The second connection electrode CNE2 may be in contact with the third electrode RME3 through the second contact CT2 penetrating the first passivation layer PAS1. The first connection electrode CNE1 and the second connection electrode CNE2 may have a shape extended in the first direction DR1 and may be disposed to extend from the emission area EMA to the subsidiary area SA.

The third connection electrode CNE3 may include a first extended portion CN_E1 disposed on one side or a side of the third electrode RME3 and extended in the first direction DR1, a second extended portion CN_E2 disposed on the second electrode RME2 and extended in the first direction DR1, and a first bridge portion CN_B1 connecting between the first extended portion CN_E1 and the second extended portion CN_E2. The first extended portion CN_E1 and the second extended portion CN_E2 of the third connection electrode CNE3 may be spaced apart from each other in the second direction DR2 with the second connection electrode CNE2 therebetween. The first extended portion CN_E1 may be spaced apart from and face the first connection electrode CNE1, and the second extended portion CN_E2 may be spaced apart from and face the second connection electrode CNE2. The first extended portion CN_E1 may be in contact with the second ends of some or a number of the first light-emitting diodes ED1, and the second extended portion CN_E2 may be in contact with the first ends of some or a number of the second light-emitting diodes ED2.

The first bridge portion CN_B1 may have a shape extended in the second direction DR2 from the subsidiary area SA, and may connect between the first extended portion CN_E1 and the second extended portion CN_E2. The second extended portion CN_E2 of the third connection electrode CNE3 may be extended to the subsidiary area SA, and may be connected to the second electrode RME2 through the second contact CT2 penetrating the first passivation layer PAS1. According to an embodiment, the width of the first bridge portion CN_B1 may be equal to the width of the third subsidiary portion CSP3. As will be described later, the first bridge portion CN_B1 may connect between the third subsidiary portions CSP3 of the extended portions CN_E1 and CN_E2, and they may have the same width.

As described above, the first connection electrode CNE1 and the second connection electrode CNE2 include main portions CMP1 and CMP2, and subsidiary portions CSP1 and CSP2, respectively. Similarly, the third connection electrode CNE3 may also include a third main portion CMP3 and a third subsidiary portion CSP3. The first light-emitting diodes ED1 and the second light-emitting diodes ED2 may be sorted into the connected light-emitting diodes ED #1 and ED #3 and the non-connected light-emitting diodes ED #2 and ED #4, respectively.

According to an embodiment, the first extended portion CN_E1 and the second extended portion CN_E2 of the third connection electrode CNE3 may include the third main portion CMP3 and the third subsidiary portion CSP3 that is connected to the main portion CMP3 and has a smaller width. The third main portion CMP3 of the first extended portion CN_E1 is spaced apart from and faces the first main portion CMP1 in the second direction DR2, and the third subsidiary portion CSP3 is connected to both sides of the third main portion CMP3 in the first direction DR1. The third subsidiary portion CSP3 of the first extended portion CN_E1 may be disposed in the emission area EMA. The third main portion CMP3 may be in contact with the second passivation layer PAS2. The first distance W1 between the first main portion CMP1 and the third main portion CMP3 may be smaller than the second distance W2 between the first subsidiary portion CSP1 and the third subsidiary portion CSP3. The first light-emitting diodes ED1 may include the first-type light-emitting diodes ED #1 having their both ends in contact with the first main portion CMP1 and the third main portion CMP3, respectively, and the second-type light-emitting diodes ED #2 having at least one of the both ends not in contact with the connection electrode CNE_1. The first-type light-emitting diodes ED #1 may be disposed between the second-type light-emitting diodes ED #2.

The third main portion CMP3 of the second extended portion CN_E2 is spaced apart from and faces the second main portion CMP2 in the second direction DR2, and the third subsidiary portion CSP3 is connected to both sides of the third main portion CMP3 in the first direction DR1. The third subsidiary portion CSP3 of the second extended portion CN_E2 may be disposed in the subsidiary area SA beyond the emission area EMA and may be connected to the third electrode contact portion CTP3 disposed in the subsidiary area SA. The third electrode contact portion CTP3 may be in contact with the second electrode RME2 through the third contact CT3. Among the third subsidiary portions CSP3 of the first and second extended portions CN_E1 and CN_E2, the third subsidiary portions CSP3 disposed on the upper side of the third main portion CMP3 may be connected with each other through the first bridge portion CN_B1. The third main portion CMP3 may be in contact with the second passivation layer PAS2. The first distance W1 between the first main portion CMP1 and the third main portion CMP3 may be smaller than the second distance W2 between the second subsidiary portion CSP2 and the third subsidiary portion CSP3. The second light-emitting diodes ED2 may include the third-type light-emitting diodes ED #3 having their both ends in contact with the second main portion CMP2 and the third main portion CMP3, respectively, and the fourth-type light-emitting diodes ED #4 having at least one of the both ends not in contact with the connection electrode CNE_1. The third-type light-emitting diodes ED #3 may be disposed between the fourth-type light-emitting diodes ED #4.

The first ends of the first-type light-emitting diodes ED #1 among the first light-emitting diode ED1 may be electrically connected to the first electrode RME1 through the first connection electrode CNE1, and the second ends of the third-type light-emitting diodes ED #3 among the second light-emitting diodes ED2 may be electrically connected to the third electrode RME3 through the second connection electrode CNE2. The second ends of the first-type light-emitting diodes ED #1 may be connected in series with the first ends of the third-type light-emitting diodes ED #3 through the third connection electrode CNE3. In addition to the parallel connection of the light-emitting diodes ED, the light-emitting diodes ED: ED1 and ED2 located or disposed on the opposite sides of the third protruding pattern BN3, respectively, may be connected in series. Unlike an embodiment of FIG. 2, the display device 10_1 according to this embodiment may include a greater number of light-emitting diodes ED for each of the sub-pixels SPXn to implement the serial connection, thereby increasing the amount of emitted light per unit area.

Figure 14:
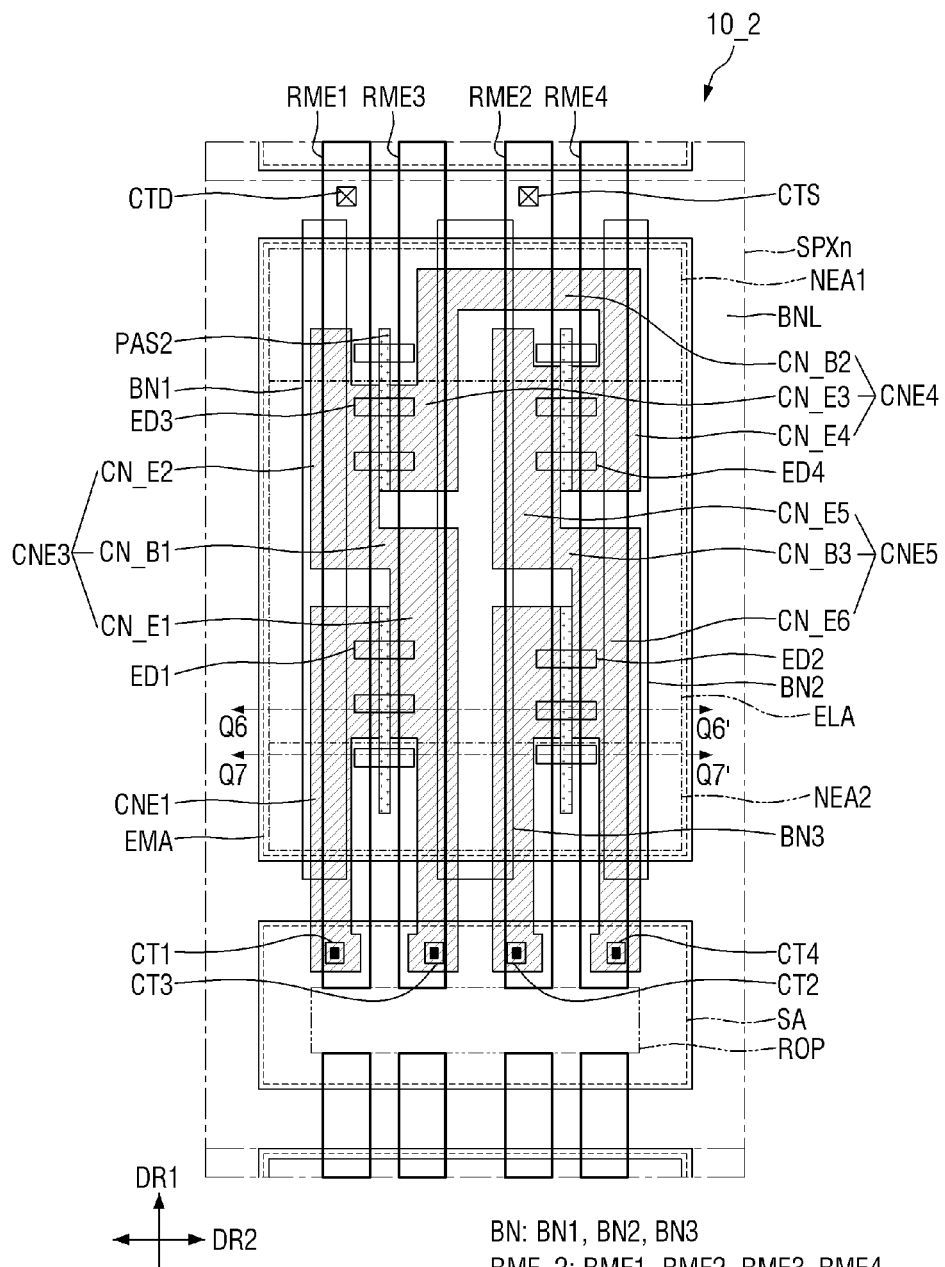
FIG. 14 is a schematic plan view showing a sub-pixel of a display device according to an embodiment.
Figure 15:
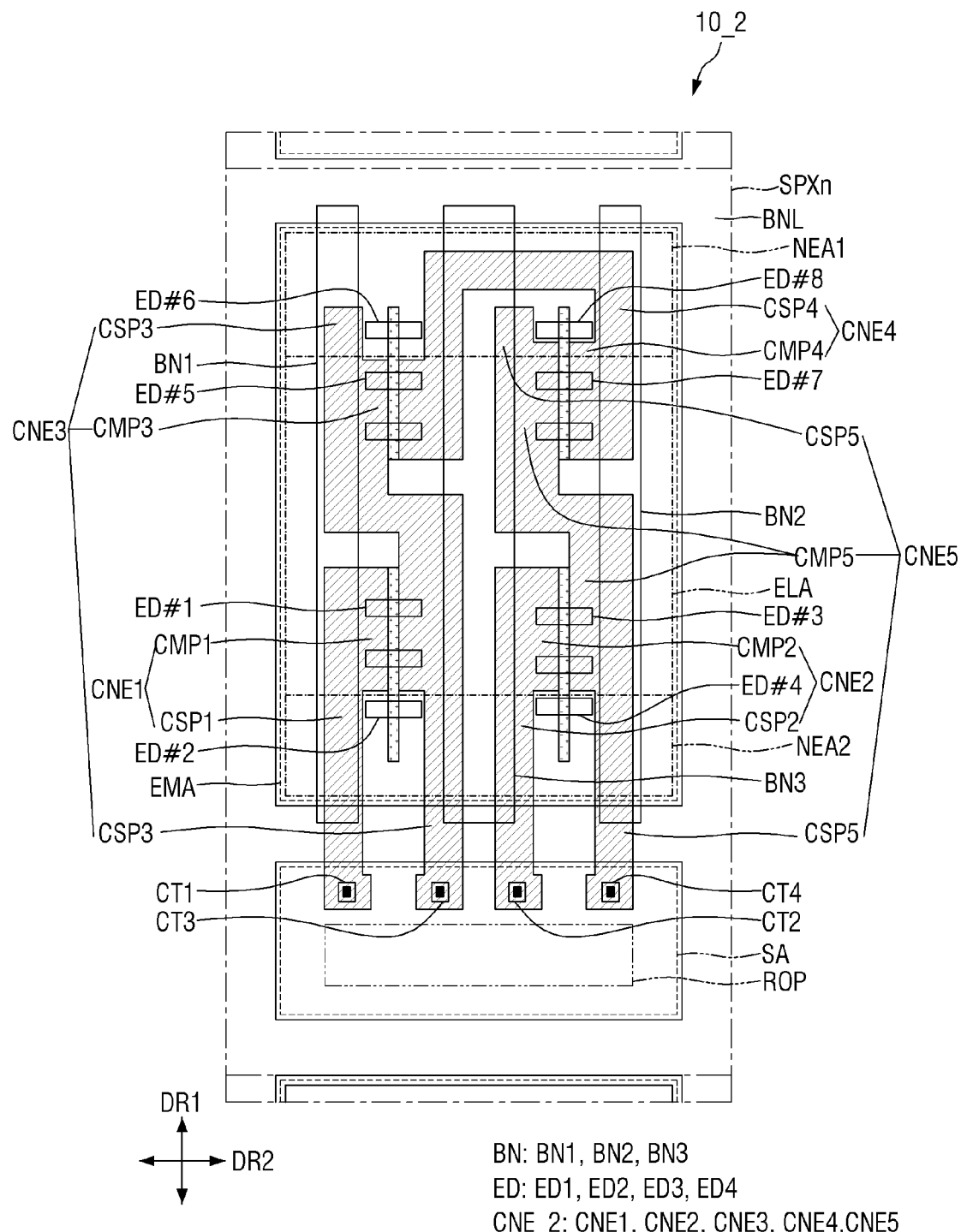
FIG. 15 is a schematic plan view showing relative arrangements of protruding patterns, a bank, connection electrodes, and light-emitting diodes disposed on a sub-pixel of FIG. 14.
Figure 16:
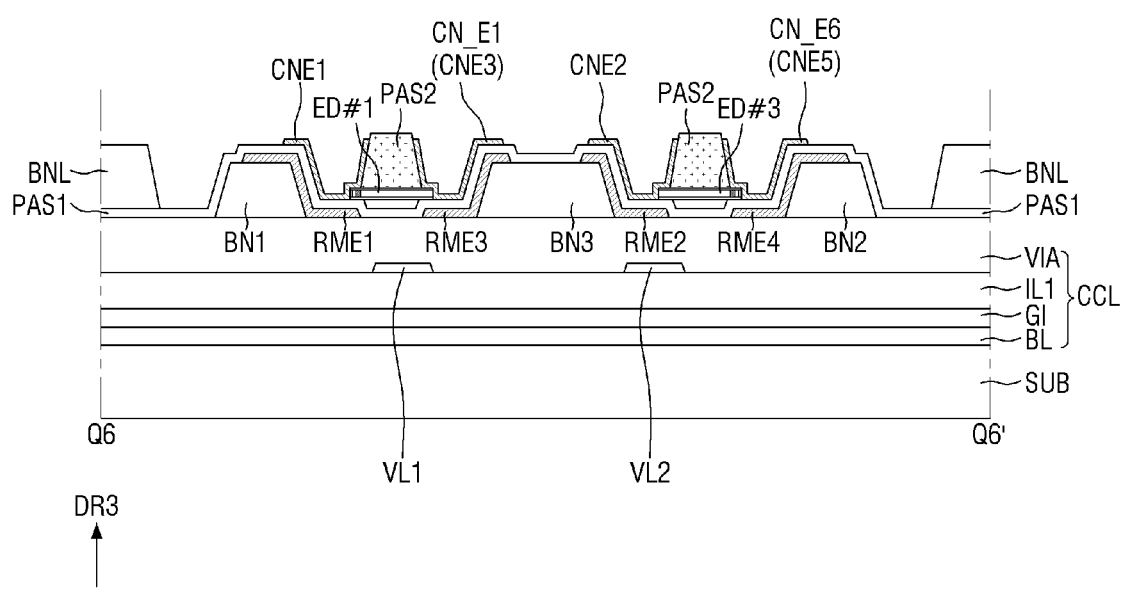
FIG. 16 is a schematic cross-sectional view taken along line Q6-Q6' of FIG. 14.
Figure 17:
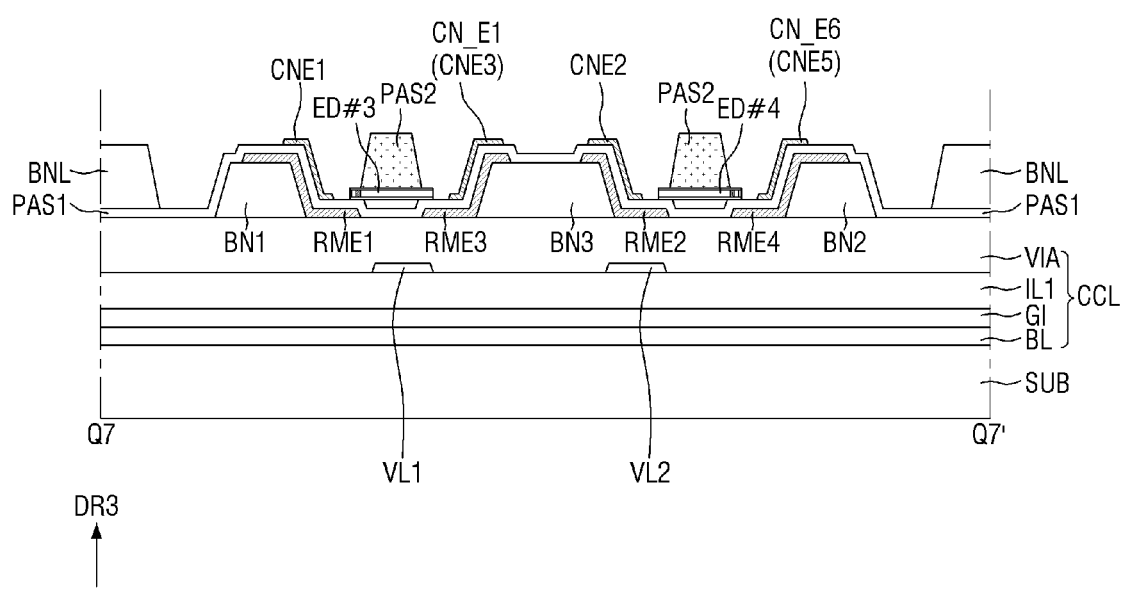
FIG. 17 is a schematic cross-sectional view taken along line Q7-Q7' of FIG. 14.

FIG. 14 is a schematic plan view showing a sub-pixel of a display device according to an embodiment. FIG. 15 is a schematic plan view showing relative arrangements of protruding patterns, a bank, connection electrodes, and light-emitting diodes disposed on a sub-pixel of FIG. 14. FIG. 16 is a schematic cross-sectional view taken along line Q6-Q6' of FIG. 14. FIG. 17 is a schematic cross-sectional view taken along line Q7-Q7' of FIG. 14. FIG. 16 shows a cross section passing through the both ends of connected light-emitting diodes. FIG. 17 shows a cross section passing through the both ends of non-connected light-emitting diodes.

Referring to FIGS. 14 to 17, a display device 10_2 according to an embodiment may include a greater number of electrodes RME_2 for each of the sub-pixels SPXn, and the number of light-emitting diodes ED disposed in each of the sub-pixels SPXn may increase. Accordingly, a greater number of the connection electrodes CNE_2 including main portions CMP1, CMP2, CMP3, CMP4 and CMP5 and subsidiary portions CSP1, CSP2, CSP3, CSP4 and CSP5 may be disposed. In the display device 10_2, four electrodes RME_2: RME1, RME2, RME3 and RME4 may be disposed for each of the sub-pixels SPXn, and five connection electrodes CNE_2: CNE1, CNE2, CNE3, CNE4 and CNE5 for serial connection configuration of the light-emitting diodes ED: ED1, ED2, ED3, and ED4 disposed therebetween may be disposed. In the following description, descriptions will focus on the difference, and the redundant descriptions will be omitted.

The first electrode RME1_2, the third electrode RME3_2, the second electrode RME2_2 and the fourth electrode RME4_2 are arranged or disposed in this order in the second direction DR2. The electrodes RME_2 may be extended in the first direction DR1 and may be arranged or disposed across the emission area EMA and the subsidiary area SA.

The first electrode RME1 is disposed on the first protruding pattern BN1, and the third electrode RME3 is disposed on one side or a side of the third protruding pattern BN3. The second electrode RME2 may be disposed on the opposite side of the third protruding pattern BN3, and the fourth electrode RME4 may be disposed on the second protruding pattern BN2. The electrodes RME_2 may be spaced apart from each other in the second direction DR2, and the first electrode RME1 and the third electrode RME3 may face each other, and the second electrode RME2 and the fourth electrode RME4 may face each other.

The first electrode RME1 and the second electrode RME2 may be connected or connected directly to the third conductive layer through a first contact hole CTD and a second contact hole CTS penetrating through the via layer VIA, respectively, which are formed at such locations that they overlap the bank BNL. On the other hand, the third electrode RME3 and the fourth electrode RME4 may not be connected or directly connected to the third conductive layer. The third electrode RME3 and the fourth electrode RME4 may be connected to the third and fifth connection electrodes CNE3 and CNE5, respectively, and electric signals flowing along the light-emitting diodes ED may be applied thereto. As will be described later, the third electrode RME3 and the fourth electrode RME4 together with the third connection electrode CNE3 and the fifth connection electrode CNE5 may provide electrical connection paths for different light-emitting diodes ED.

Among the light-emitting diodes ED, the first light-emitting diodes ED1 and the third light-emitting diodes ED3 may be disposed between the first protruding pattern BN1 and the third protruding pattern BN3, and the second light-emitting diodes ED2 and the fourth light-emitting diodes ED4 may be disposed between the third protruding pattern BN3 and the second protruding pattern BN2. The first light-emitting diodes ED1 and second light-emitting diodes ED2 may be disposed in the emission area EMA of each sub-pixel SPXn adjacent to the subsidiary area SA of the sub-pixel SPXn, while the third light-emitting diodes ED3 and fourth light-emitting diodes ED4 may be disposed in the emission area EMA of the sub-pixel SPXn adjacent to the subsidiary area SA of another sub-pixel SPXn. In other words, the first light-emitting diodes ED1 and the second light-emitting diodes ED2 may be disposed on one side or a side of the emission area EMA in the first direction DR1, for example, on the lower side, and the third light-emitting diodes ED3 and the fourth light-emitting diodes ED4 may be disposed on the opposite side of the emission area EMA in the first direction DR1, for example, on the upper side.

It is to be noted that the light-emitting diodes ED may not be sorted by their positions in the emission area EMA but may be sorted by connection relationships with the connection electrodes CNE_2 to be described later. The both ends of the light-emitting diodes ED may be in contact with different connection electrodes CNE_2 depending on the arrangement structure of the connection electrodes CNE_2, and may be sorted into different light-emitting diodes ED depending on the types of the connection electrodes CNE_2 which they are in contact with.

The first ends of the first light-emitting diodes ED1 and the third light-emitting diodes ED3 may be disposed on the first electrode RME1, and the second ends thereof may be disposed on the third electrode RME3. The first ends of the second light-emitting diodes ED2 and the fourth light-emitting diodes ED4 may be disposed on the fourth electrode RME4, and the second ends thereof may be disposed on the second electrode RME2. The first ends of the first light-emitting diodes ED1 and the third light-emitting diodes ED3 may face in a direction different from a direction in which the first ends of the second light-emitting diodes ED2 and fourth light-emitting diodes ED4 face.

The second passivation layer PAS2 may include pattern portions disposed on the light-emitting diodes ED between the protruding patterns BN1, BN2 and BN3. The pattern portions of the second passivation layer PAS2 may be extended in the first direction DR1 to cover or overlap the light-emitting diodes ED: ED1, ED2, ED3 and ED4. These may surround and fix the light-emitting diodes ED.

The connection electrodes CNE_2 may further include the third connection electrode CNE3, the fourth connection electrode CNE4 and the fifth connection electrode CNE5 disposed across the electrodes RME_2, in addition to the first connection electrode CNE1 disposed on the first electrode RME1 and the second connection electrode CNE2 disposed on the second electrode RME2.

Unlike embodiments of FIGS. 2 and 10, each of the first and second connection electrodes CNE1 and CNE2 may have relatively short lengths extended in the first direction DR1. The first connection electrode CNE1 and the second connection electrode CNE2 may be disposed on the lower side of the center of the emission area EMA. The first connection electrode CNE1 and the second connection electrode CNE2 may be disposed across the emission area EMA and the subsidiary area SA of the respective sub-pixel SPXn, and may be in contact with the first electrode RME1 and the second electrode RME2 through the first contact CT1 and the second contact CT2 formed in the subsidiary area SA, respectively. The subsidiary portions CSP1 and CSP2 of the first connection electrode CNE1 and the second connection electrode CNE2 may be connected to only one side or a side of the main portions CMP1 and CMP2, respectively, in the first direction DR1. The first main portion CMP1 of the first connection electrode CNE1 may be disposed in the emission area EMA, and the first subsidiary portion CSP1 may be connected to the lower side of the first main portion CMP1 and may be extended to the subsidiary area SA. The first bridge portion CN_B1 of the third connection electrode CNE3 may be disposed on the upper side of the first main portion CMP1 to be spaced apart from it. Similarly, the second main portion CMP2 of the second connection electrode CNE2 may be disposed in the emission area EMA, and the second subsidiary portion CSP2 may be connected to the lower side of the second main portion CMP2 and may be extended to the subsidiary area SA. A third bridge portion CN_B3 of the fifth connection electrode CNE5 may be disposed on the upper side of the second main portion CMP2 to be spaced apart from it.

The third connection electrode CNE3 may include a first extended portion CN_E1 disposed on the third electrode RME3, a second extended portion CN_E2 disposed on the first electrode RME1, and the first bridge portion CN_B connecting between the first extended portion CN_E1 and the second extended portion CN_E2. The first extended portion CN_E1 may be spaced apart from and face the first connection electrode CNE1 in the second direction DR2, and the second extended portion CN_E2 may be spaced apart from the first connection electrode CNE1 in the first direction DR1. The first extended portion CN_E1 may be disposed on the lower side in the emission area EMA of the respective sub-pixel SPXn, and the second extended portion CN_E2 may be disposed on the upper side in the emission area EMA. The first extended portion CN_E1 may be disposed across the emission area EMA and the subsidiary area SA to be connected to the third electrode RME3 through a third contact part CT3 formed in the subsidiary area SA. The first bridge portion CN_B1 may be disposed across the first electrode RME1 and the third electrode RME3 in the middle of the emission area EMA. The third connection electrode CNE3 may be generally extended in the first direction DR1 and may have a shape that is bent in the second direction DR2 and extended in the first direction DR1 again.

The fourth connection electrode CNE4 may include a third extended portion CN_E3 disposed on the third electrode RME3, a fourth extended portion CN_E4 disposed on the fourth electrode RME4, and a second bridge portion CN_B2 connecting between the third extended portion CN_E3 and the fourth extended portion CN_E4. The third extended portion CN_E3 may be spaced apart from and face the second extended portion CN_E2 of the third connection electrode CNE3 in the second direction DR2, and the fourth extended portion CN_E4 may be spaced apart from and face a sixth extended portion CN_E6 of the fifth connection electrode CNE5 to be described in the first direction DR1. The third extended portion CN_E3 and the fourth extended portion CN_E4 may be disposed on the upper side in the emission area EMA, and the second bridge portion CN_B2 may be disposed across the third electrode RME3, the second electrode RME2, and the fourth electrode RME4. The fourth connection electrode CNE4 may be disposed in a shape that surrounds the fifth extended portion CN_E5 of the fifth connection electrode CNE5.

The fifth connection electrode CNE5 may include a fifth extended portion CN_E5 disposed on the second electrode RME2, a sixth extended portion CN_E6 disposed on the fourth electrode RME4, and a third bridge portion CN_B3 connecting between the fifth extended portion CN_E5 and the sixth bridge portion CN_E6. The fifth extended portion CN_E5 may be spaced apart from and face the fourth extended portion CN_E4 of the fourth connection electrode CNE4 in the second direction DR2, and the sixth extended portion CN_E6 may be spaced apart from the second connection electrode CNE2 in the second direction DR2. The fifth extended portion CN_E5 may be disposed on the upper side in the emission area EMA of the respective sub-pixel SPXn, and the sixth extended portion CN_E6 may be disposed on the lower side in the emission area EMA. The sixth extended portion CN_E6 may be disposed across the emission area EMA and the subsidiary area SA to be connected to the fourth electrode contact portion CTP4, and the fourth electrode contact portion CTP4 may be connected to the fourth electrode RME4 through a fourth contact CT4 formed in the subsidiary area SA. The third bridge portion CN_B3 may be disposed across the second electrode RME2 and the fourth electrode RME4 adjacent to the center of the emission area EMA. The fifth connection electrode CNE5 may be generally extended in the first direction DR1 and may have a shape that is bent in the second direction DR2 and extended in the first direction DR1 again.

The first connection electrode CNE1 and the second connection electrode CNE2 may be first-type connection electrodes in contact with the first electrode RME1 and the second electrode RME2, respectively, that may be connected or directly connected to the third conductive layer. The third connection electrode CNE3 and the fifth connection electrode CNE5 may be second-type connection electrodes in contact with the third electrode RME3 and the fourth electrode RME4, respectively, that are not connected or directly connected to the third conductive layer. The fourth connection electrode CNE4 may be a third-type connection electrode that is not in contact with the electrodes RME2.

Similarly to the first connection electrode CNE1 and the second connection electrode CNE2, the third connection electrode CNE3, the fourth connection electrode CNE4 and the fifth connection electrode CNE5 may also include main portions CMP3, CMP4 and CMP5, and subsidiary portions CSP3, CSP4 and CSP5, respectively. Each of the first extended portion CN_E1 and the second extended portion CN_E2 of the third connection electrode CNE3 may include the third main portion CMP3 and the third subsidiary portions CSP3. The third main portion CMP3 of the first extended portion CN_E1 may be spaced apart from and face the first main portion CMP1. The third main portion CMP3 of the second extended portion CN_E2 may be spaced apart from and face the fourth main portion CMP4 of the third extended portion CN_E3. The third subsidiary portion CSP3 of the first extended portion CN_E1 may be connected to the lower side of the third main portion CMP3 and may be disposed to the subsidiary area SA. The third subsidiary portion CSP3 of the first extended portion CN_E1 may be connected to the third electrode contact portion CTP3. The first bridge portion CN_B1 of the third connection electrode CNE3 may connect between the third main portions CMP3 of the extended portions CN_E1 and CN_E2.

Each of the third extended portion CN_E3 and the fourth extended portion CN_E4 of the fourth connection electrode CNE4 may include the fourth main portion CMP4 and the fourth subsidiary portions CSP4. The fourth main portion CMP4 of the third extended portion CN_E3 may be spaced apart from and face the third main portion CMP3 of the first extended portion CN_E1. The fourth main portion CMP4 of the fourth extended portion CN_E4 may be spaced apart from and face the fifth main portion CMP5 of the fifth extended portion CN_E5. The fourth subsidiary portions CSP4 may be connected to the upper side of each fourth main portion CMP4 and connected with each other through the second bridge portion CN_B2.

Each of the fifth extended portion CN_E5 and the sixth extended portion CN_E6 of the fifth connection electrode CNE5 may include the fifth main portion CMP5 and the fifth subsidiary portions CSP5. The fifth main portion CMP5 of the fifth extended portion CN_E5 may be spaced apart from and face the fourth main portion CMP5 of the fourth extended portion CN_E4. The fifth main portion CMP5 of the sixth extended portion CN_E6 may be spaced apart from and face the second main portion CMP2. The fifth subsidiary portion CSP5 of the fifth extended portion CN_E5 may be connected to the upper side of the fifth main portion CMP5. The fifth subsidiary portion CSP5 of the sixth extended portion CN_E6 may be connected to the lower side of the fifth main portion CMP5 to be disposed to the subsidiary area SA. The fifth subsidiary portion CSP5 of the sixth extended portion CN_E6 may be connected to the fifth electrode contact CMP5. The third bridge portion CN_B3 of the fifth connection electrode CNE5 may connect between the fifth main portions CMP5 of the extended portions CN_E5 and CN_E6.

As described above, the light-emitting diodes ED may be sorted into different light-emitting diodes ED by the connection electrodes CNE_2 which their both ends are in contact with, in accordance with the arrangement structure of the connection electrodes CNE_2.

The first light-emitting diodes ED1 may include the first-type light-emitting diodes ED #1 having their both ends in contact with the first main portion CMP1 and the third main portion CMP3, respectively, and the second-type light-emitting diodes ED #2 having at least one of the both ends not in contact with the connection electrode CNE_2. In an embodiment, both ends of the second-type light-emitting diodes ED #2 may be spaced apart from the first subsidiary portion CSP1 and the third subsidiary portion CSP3 and may not be in contact with them. The second light-emitting diodes ED2 may include the third-type light-emitting diodes ED #3 having their both ends in contact with the second main portion CMP2 and the fifth main portion CMP5, respectively, and the fourth-type light-emitting diodes ED #4 having at least one of the both ends not in contact with the connection electrode CNE_2. In an embodiment, the both ends of the fourth-type light-emitting diodes ED #4 may be spaced apart from the second subsidiary portion CSP2 and the fifth subsidiary portion CSP5 and may not be in contact with them.

The third light-emitting diodes ED3 may include the fifth-type light-emitting diodes ED #5 having their both ends in contact with the third main portion CMP3 and the fourth main portion CMP4, respectively, and the sixth-type light-emitting diodes ED #6 having at least one of the both ends not in contact with the connection electrode CNE_2. In an embodiment, the both ends of the sixth-type light-emitting diodes ED #6 may be spaced apart from the third subsidiary portion CSP3 and the fourth subsidiary portion CSP4 and may not be in contact with them. The fourth light-emitting diodes ED4 may include the seventh-type light-emitting diodes ED #7 having their both ends in contact with the fourth main portion CMP4 and the fifth main portion CMP5, respectively, and the eighth-type light-emitting diodes ED #8 having at least one of the both ends not in contact with the connection electrode CNE_2. In an embodiment, the both ends of the eighth-type light-emitting diodes ED #8 may be spaced apart from the fourth subsidiary portion CSP4 and the fifth subsidiary portion CSP5 and may not be in contact with them. The first-type light-emitting diodes ED #1, the third-type light-emitting diodes ED #3, the fifth-type light-emitting diodes ED #5 and the seventh-type light-emitting diodes ED #7 may be connected light-emitting diodes. The second-type light-emitting diode ED #2, the fourth-type light-emitting diode ED #4, the sixth-type light-emitting diode ED #6 and the eighth-type light-emitting diode ED #8 may be non-connected light-emitting diodes. The connected light-emitting diodes may be connected in series to each other through the connection electrodes CNE_2. According to this embodiment, the display device 10_2 may include a greater number of light-emitting diodes ED for each of the sub-pixels SPXn to form the serial connection, thereby further increasing the amount of emitted light per unit area.

Figure 18:
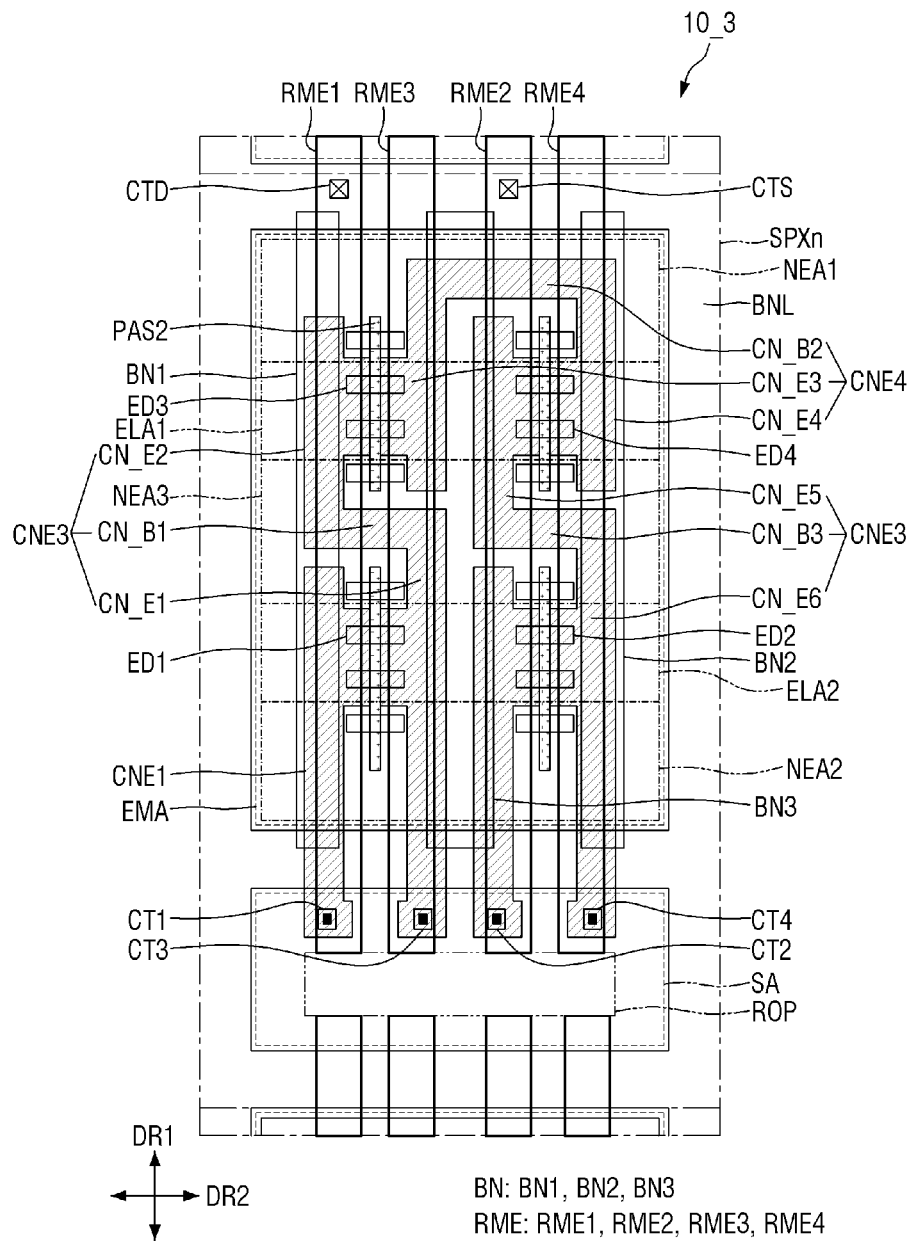
FIG. 18 is a schematic plan view showing a sub-pixel of a display device according to an embodiment.
Figure 19:
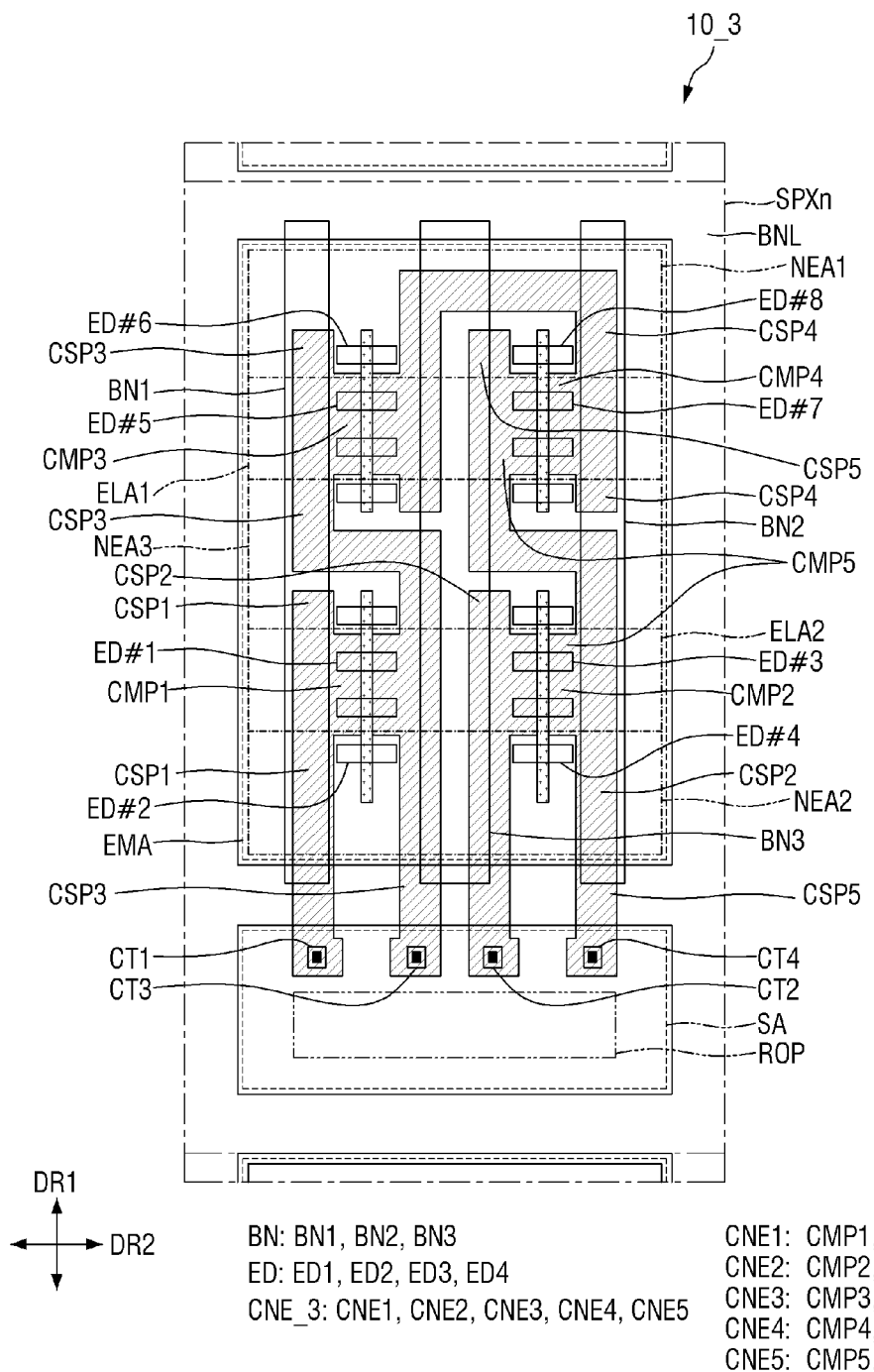
FIG. 19 is a schematic plan view showing relative arrangements of protruding patterns, a bank, connection electrodes, and light-emitting diodes disposed on a sub-pixel of FIG. 18.

FIG. 18 is a schematic plan view showing a sub-pixel of a display device according to an embodiment. FIG. 19 is a schematic plan view showing relative arrangements of protruding patterns, a bank, connection electrodes, and light-emitting diodes disposed on a sub-pixel of FIG. 18.

Referring to FIGS. 18 and 19, in a display device 10_3 according to an embodiment, connection electrodes CNE_3 may include main portions CMP1, CMP2, CMP3, CMP4 and CMP5, and subsidiary portions CSP1, CSP2, CSP3, CSP4 and CSP5 connected to the both sides of the main portions in the first direction DR1. Accordingly, light-emitting areas ELA1 and ELA2 separated from each other may be located or disposed between a first non-light-emitting area NEA1 and a second non-light-emitting area NEA2 adjacent to the bank BNL in the emission area EMA, and a third non-light-emitting area NEA3 may be disposed between the light-emitting areas ELA1 and ELA2. This embodiment is different from an embodiment of FIG. 7 in that the shape of the connection electrodes CNE_3 is different. In the following description, descriptions will focus on the difference, and the redundant descriptions will be omitted.

On the upper side of the center of the emission area EMA of each sub-pixel SPXn, a third main portion CMP3 of a second extended portion CN_E2 of a third connection electrode CNE3, fourth main portions CMP4 of a fourth connection electrode CNE4, and a fifth main portion CMP5 of a fifth extended portion CN_E5 of a fifth connection electrode CNE5 are disposed. The area in which the main portions are disposed may be defined as a first light-emitting area ELA1.

On the lower side of the center of the emission area EMA of each sub-pixel SPXn, a first main portion CMP1 of a first connection electrode CNE1, a second main portion CMP2 of a second connection electrode CNE2, the third main portion CMP3 of the first extended portion CN_E1 of the third connection electrode CNE3, and a fifth main portion CMP5 of a sixth extended portion CN_E6 of the fifth connection electrode CNE5. The area in which the main portions are disposed may be defined as a second light-emitting area ELA2.

On the upper side of the first light-emitting area ELA1, the third subsidiary portion CSP3 of the second extended portion CN_E2 of the third connection electrode CNE3, the fourth subsidiary portions CSP4 of the fourth connection electrode CNE4, and the fifth subsidiary portion CSP5 of the fifth extended portion CN_E5 of the fifth connection electrode CNE5 may be disposed. The area in which the subsidiary portions are disposed may be defined as a first non-light-emitting area NEA1 On the lower side of the second light-emitting area ELA2, the first subsidiary portion CSP1 of the first connection electrode CNE1, the second subsidiary portion CSP2 of the second connection electrode CNE2, the third subsidiary portion CSP3 of the first extended portion CN_E1 of the third connection electrode CNE3, and the fifth subsidiary portion CSP5 of the sixth extended portion CN_E6 of the fifth connection electrode CNE5 may be disposed. The area in which the subsidiary portions are disposed may be defined as a second non-light-emitting area NEA2.

The subsidiary portions of each of the connection electrodes CNE_3 may be disposed between the first light-emitting area ELA1 and the second light-emitting area ELA2. A third non-light-emitting area NEA3 may be defined between the first light-emitting area ELA1 and the second light-emitting area ELA2. In the display device 10_3 according to this embodiment, the connection electrodes CNE_3 may include more non-light-emitting areas NEA1, NEA2 and NEA3 in each of the sub-pixels SPXn.

Incidentally, the pattern portions of the second passivation layer PAS2 covering or overlapping the light-emitting diodes ED have a shape extended in the first direction DR1 while exposing the both ends of the light-emitting diodes ED, they may have the length in the first direction DR1 that is larger than the width measured in the second direction DR2. The pattern portions having such a shape may be easily delaminated during a subsequent process. For this reason, the second passivation layer PAS2 may include portions that have a larger width and connected to the pattern portions, so that it can have a structure that prevents delamination of the pattern portions.

Figure 20:
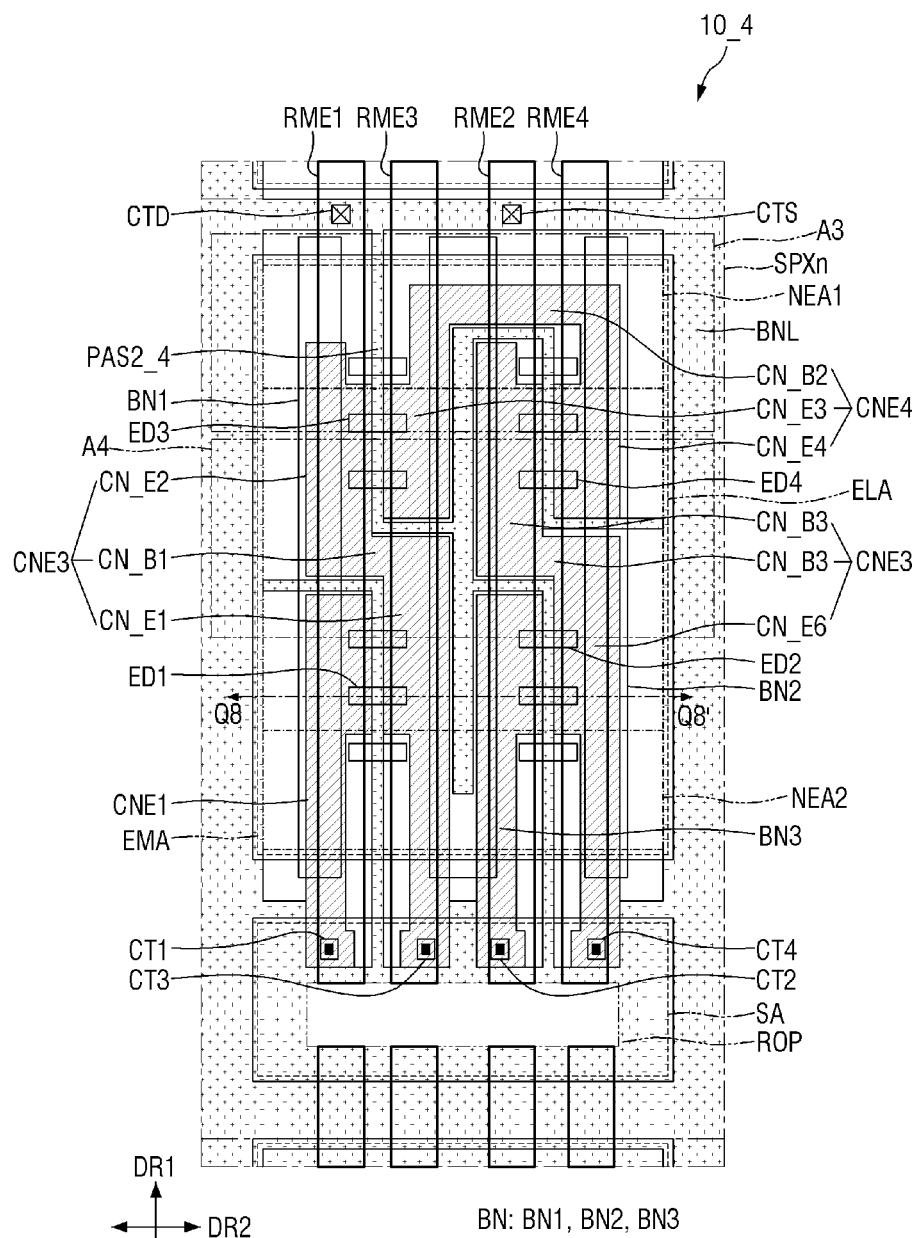
FIG. 20 is a schematic plan view showing a sub-pixel of a display device according to an embodiment.
Figure 21:
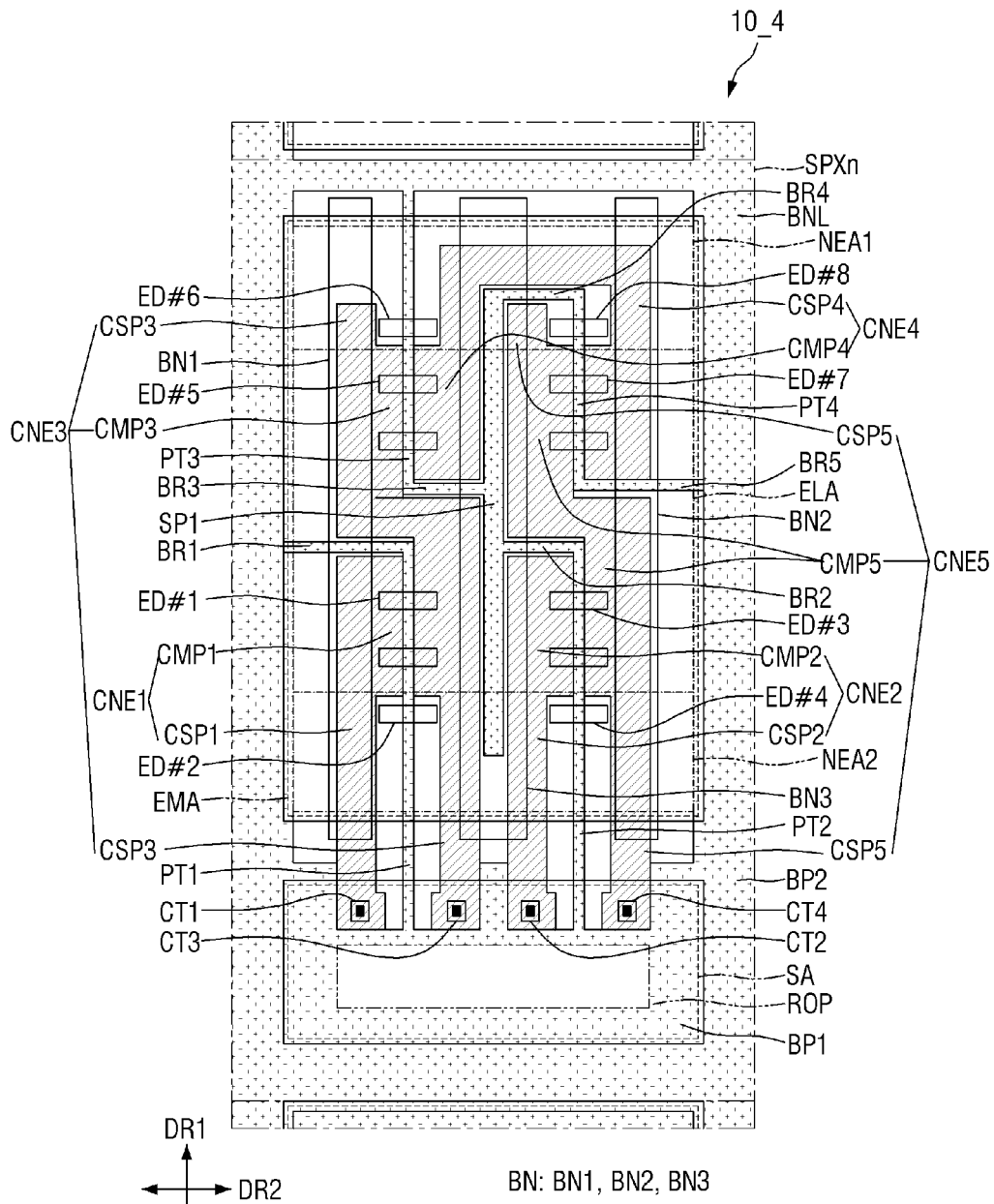
FIG. 21 is a schematic plan view showing relative arrangements of protruding patterns, a bank, connection electrodes, and a second insulating layer disposed in a sub-pixel of FIG. 20.
Figure 22:
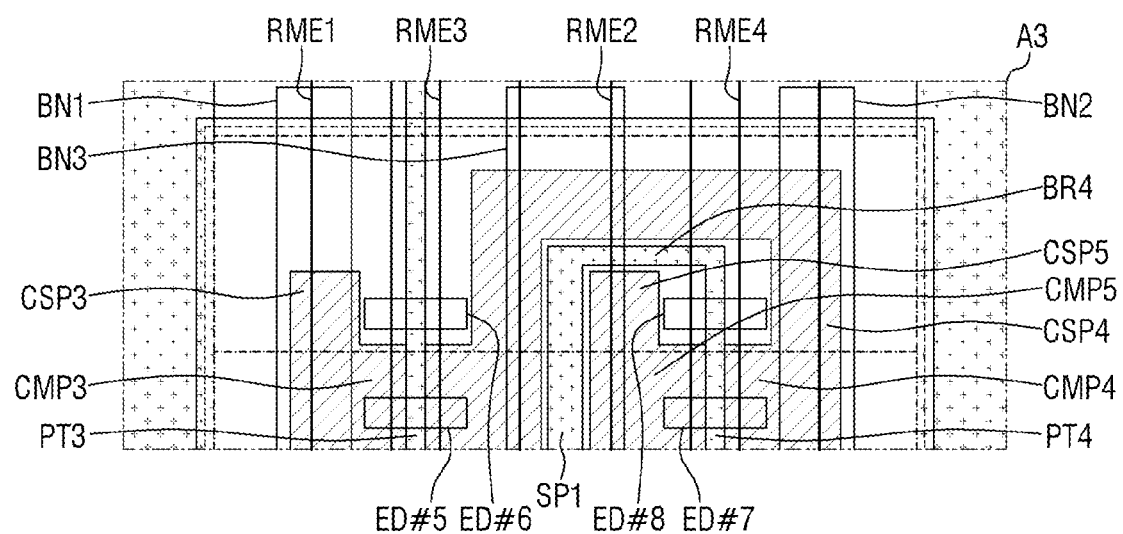
FIG. 22 is an enlarged view of portion A3 of FIG. 20.
Figure 23:
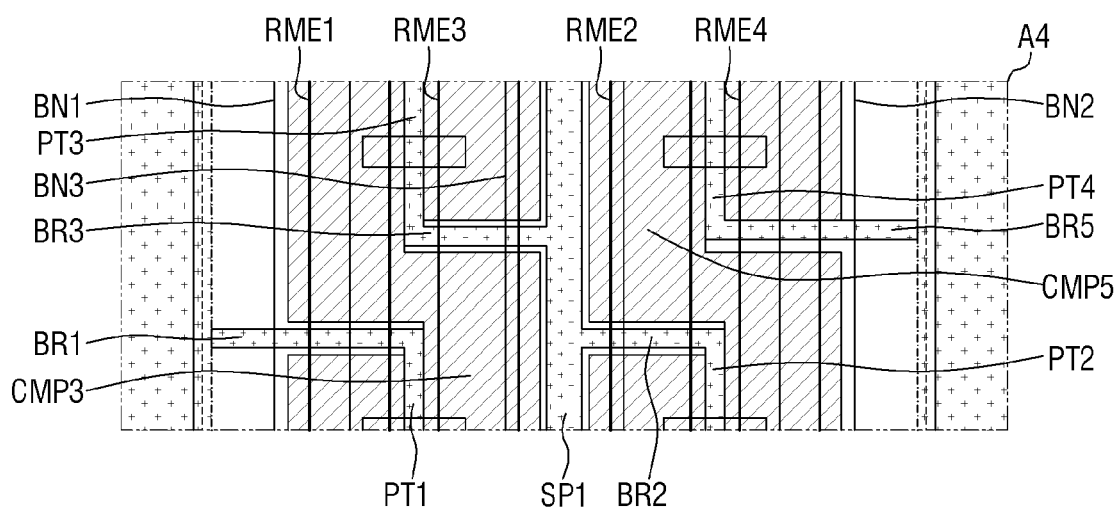
FIG. 23 is an enlarged view of portion A4 of FIG. 20.
Figure 24:
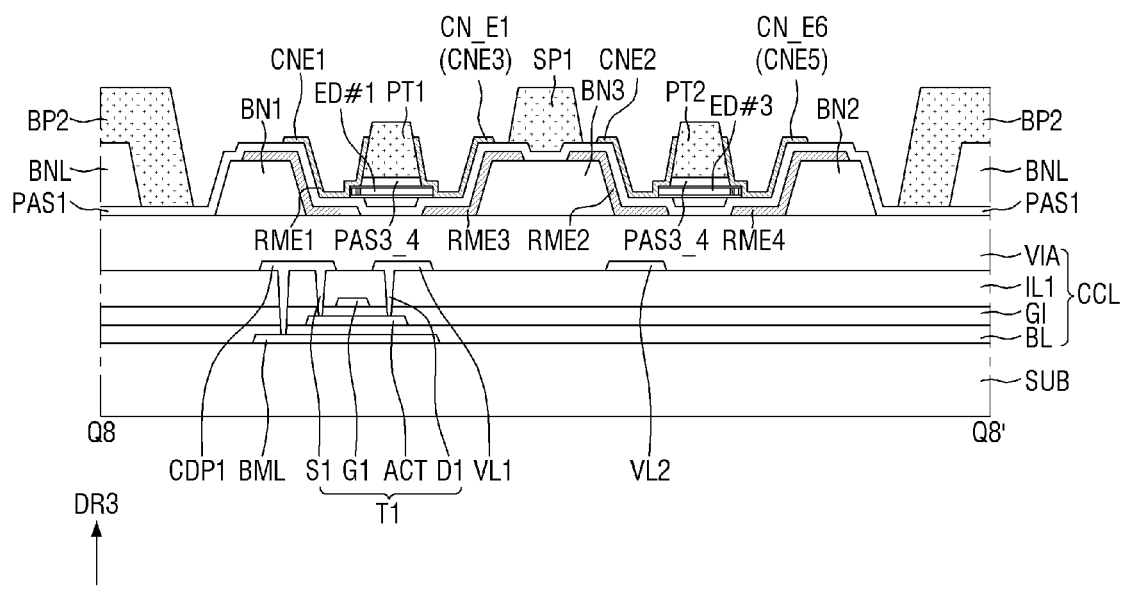
FIG. 24 is a schematic cross-sectional view taken along line Q8-Q8' of FIG. 20.

FIG. 20 is a schematic plan view showing a sub-pixel of a display device according to an embodiment. FIG. 21 is a schematic plan view showing relative arrangements of protruding patterns, a bank, connection electrodes, and a second insulating layer disposed in a sub-pixel of FIG. 20. FIG. 22 is an enlarged view of portion A3 of FIG. 20. FIG. 23 is an enlarged view of portion A4 of FIG. 20. FIG. 24 is a schematic cross-sectional view taken along line Q8-Q8' of FIG. 20.

Referring to FIGS. 20 to 24, a display device 10_4 according to this embodiment may include pattern portions PT1, PT2, PT3 and PT4 of a second passivation layer PAS2_4 covering or overlapping light-emitting diodes ED, a first support pattern SP1 and bases BP1 and BP2 to prevent them from being delaminated, and bridges BR1, BR2, BR3, BR4 and BR5 connecting the pattern portions PT1, PT2, PT3 and PT4 with the first support pattern SP1 or the bases BP1, BP2. This embodiment is different from an embodiment of FIG. 14 in that the second passivation layer PAS2_4 has a structure to prevent delamination of the pattern portions PT1, PT2, PT3 and PT4. In the following description, descriptions will focus on the difference, and the redundant description will be omitted.

The second passivation layer PAS2_4 may include a first pattern portion PT1 disposed on first light-emitting diodes ED1, a second pattern portion PT2 disposed on second light-emitting diodes ED2, a third pattern portion PT3 disposed on third light-emitting diodes ED3, and a fourth pattern portion PT4 disposed on fourth light-emitting diodes ED4.

The first pattern portion PT1 and the third pattern portion PT3 may be disposed between the first protruding pattern BN1 and the third protruding pattern BN3, and may be spaced apart from each other in the first direction DR1 with a first bridge portion CN_B1 of a third connection electrode CNE3. The first pattern portion PT1 and the third pattern portion PT3 may be spaced apart from the first bridge portion CN_B1. One side or a side of the first pattern portion PT1 in the first direction DR1 may be connected to the first base BP1 beyond the bank BNL, and one side or a side of the third pattern portion PT3 in the first direction DR1 may be connected to the second base BP2 disposed on the bank BNL.

The second pattern portion PT2 and the fourth pattern portion PT4 may be disposed between the third protruding pattern BN3 and the second protruding pattern BN2, and may be spaced apart from each other in the first direction DR1 with a third bridge portion CN_B1 of a fifth connection electrode CNE5. The second pattern portion PT2 and the fourth pattern portion PT4 may be spaced apart from the third bridge portion CN_B3. One side or a side of the second pattern portion PT2 in the first direction DR1 may be connected to the first base BP1 beyond the bank BNL, and one side or a side of the fourth pattern portion PT4 in the first direction DR1 may be connected to the second base BP2 disposed on the bank BNL.

The second passivation layer PAS2_4 may include the first base BP1 disposed in the subsidiary area SA, and the second base BP2 disposed on the bank BNL. Some or a number of the pattern portions disposed in the emission area EMA may be extended in the first direction DR1 to be connected to the first base BP1 or the second base BP2.

The first base BP1 may be disposed on the entire surface of the subsidiary area SA except for the separation region ROP and the locations where the connection electrodes CNE_4 are disposed. In the separation region ROP, after the second passivation layer PAS2_4 is formed, a process of separating the electrodes RME thereunder may be carried out. Accordingly, the first base BP1 may not be disposed in the separation region ROP. Since the connection electrodes CNE are disposed locations where the second passivation layer PAS2_4 is not disposed and are disposed over the side surfaces of the second passivation layer PAS24, the first base BP1 may not overlap the connection electrodes CNE in the thickness direction.

The second base BP2 is disposed on the bank BNL. The second base BP2 may include a portion extended in the first direction DR1, a portion extended in the second direction DR2, and a portion protruding in the second direction DR2. The second base BP2 may be extended in the first direction DR1 between the sub-pixels SPXn adjacent to each other in the second direction DR2 and may be extended in the second direction DR2 between the sub-pixels SPXn adjacent to each other in the first direction DR1. A part of the portion of the second base BP2 that is extended in the first direction DR1 may protrude in the second direction DR2 to be disposed on the bank BNL between the emission area EMA and the subsidiary area SA of each sub-pixel SPXn. Since the connection electrodes CNE are disposed on the bank BNL between the emission area EMA and the subsidiary area SA of each sub-pixel SPXn, the part of the portion of the second base BP2 that is extended in the first direction DR1 may be disposed on the bank BNL so that it does not overlap the connection electrodes CNE. At the border of the subsidiary area SA surrounded by the bank BNL, the first base BP1 and the second base BP2 may be in contact with each other.

Each of the first base BP1 and the second base BP2 may have the thickness equal to that of the pattern portions, and may have a larger width measured in the second direction DR2 than that of the pattern portions. While the pattern portions PT1, PT2, PT3 and PT4 have a width smaller than the length of the light-emitting diodes ED, the widths of the first and second bases BP1 and BP2 may be greater than that of the bank BNL or may be equal to that of the area surrounded by the bank BNL. Compared to the pattern portions PT1, PT2, PT3 and PT4, the first base BP1 and the second base BP2 are not delaminated but can be firmly disposed on the first passivation layer PAS1 and the bank BNL.

The first support pattern SP1 is disposed on the third protruding pattern BN3. The first support pattern SP1 may partially overlap each of the second electrode RME2 and the third electrode RME3. The first support pattern SP1 may have a shape extended in the first direction DR1. The first support pattern part SP1 may also be firmly disposed on the first passivation layer PAS1, similar to the first base BP1 and the second base BP2.

The second passivation layer PAS2_4 may include the bridge parts connecting the pattern portions PT1, PT2, PT3 and PT4 with the second base BP2 or the first support pattern SP1.

The first bridge BR1 may be connected to the first pattern portion PT1 and a part of the second base BP2 extended in the first direction DR1. The first bridge BR1 may be disposed between the first connection electrode CNE1 and the second extended portion CN_E2 of the third connection electrode CNE3 and may have a shape extended in the second direction DR2. The first bridge BR1 may be spaced apart from the first connection electrode CNE1 and the third connection electrode CNE3. The second bridge BR2 may be connected to the second pattern portion PT2 and the first support pattern SP1. The second bridge BR1 may be disposed between the second connection electrode CNE2 and the fifth extended portion CN_E5 of the fifth connection electrode CNE5 and may have a shape extended in the second direction DR2. The second bridge BR2 may be spaced apart from the second connection electrode CNE2 and the fifth connection electrode CNE5.

The third bridge BR3 may be connected to the third pattern portion PT3 and the first support pattern SP1. The third bridge BR3 may be disposed between the first extended portion CN_E1 of the third connection electrode CNE3 and the third extended portion CN_E3 of the fourth connection electrode CNE4 and may have a shape extended in the second direction DR2. The third bridge BR3 may be spaced apart from the third connection electrode CNE3 and the fourth connection electrode CNE4. The fourth bridge BR4 may be connected to the fourth pattern portion PT4 and the first support pattern SP1. The fourth bridge BR4 may be disposed between the second bridge portion CN_B2 of the fourth connection electrode CNE4 and the fifth extended portion CN_E5 of the fifth connection electrode CNE5 and may have a shape extended in the second direction DR2. The fourth bridge BR4 may be spaced apart from the fourth connection electrode CNE4 and the fifth connection electrode CNE5.

The fifth bridge BR5 may be connected to the fourth pattern portion PT4 and a part of the second base BP2 extended in the first direction DR1. The fifth bridge BR5 may be disposed between the fourth extended portion CN_E4 of the fourth connection electrode CNE4 and the sixth extended portion CN_E6 of the fifth connection electrode CNE5 and may have a shape extended in the second direction DR2. The fifth bridge BR5 may be spaced apart from the fourth connection electrode CNE4 and the fifth connection electrode CNE5.

According to an embodiment, the bridge portions BR1, BR2, BR3, BR4 and BR5 of the second passivation layer PAS2_4 and the first support pattern SP1 are spaced apart from the connection electrodes CNE_4, and may have widths greater than that of the pattern portions PT1, PT2, PT3 and PT4. As described above, the second passivation layer PAS2_4 is disposed so that it does not overlap the connection electrodes CNE_2 in the thickness direction. The pattern portions PT1, PT2, PT3 and PT4 of the second passivation layer PAS2_4 and the bridges BR1, BR2, BR3, BR4 and BR5 are connected with each other and thus are not delaminated, and may be spaced apart from the connection electrodes CNE_4.

The first pattern portion PT1, the second pattern portion PT2 and the third pattern portion PT3 of the second passivation layers PAS2_4 may be extended in the first direction DR1 and each may be connected to the first base BP1 or the second base BP2. The first pattern portion PT1, the second pattern portion PT2 and the third pattern portion PT3 may cover or overlap the first light-emitting diodes ED1, the second light-emitting diodes ED2 and the third light-emitting diodes ED3, irrespective of whether they are connected light-emitting diodes or non-connected light-emitting diodes. As the second passivation layer PAS2_4 has such a structure, the light-emitting diodes ED aligned adjacent to the bank BNL on the upper and lower sides of the emission area EMA may be fixed on the electrodes RME. In case that this happens, it is not easy to control the number of light-emitting diodes ED at those locations as described above. The display device 10_4 according to an embodiment has the structure capable of preventing the delamination of the pattern portions of the second passivation layer PAS2_4, while the connection electrodes CNE_4 include electrode main portions and electrode subsidiary portions to define the light-emitting areas ELA and the non-light-emitting areas NEA1 and NEA2 in which connected light-emitting diodes are disposed. Accordingly, even if the second passivation layer PAS2_4 fixes the undesired light-emitting diodes ED, only some or a number of the light-emitting diodes ED may be connected to the connection electrodes CNE_4, and there is an advantage that it is possible to control the number of connected light-emitting diodes that emit light in each of the sub-pixels SPXn.

Figure 25:
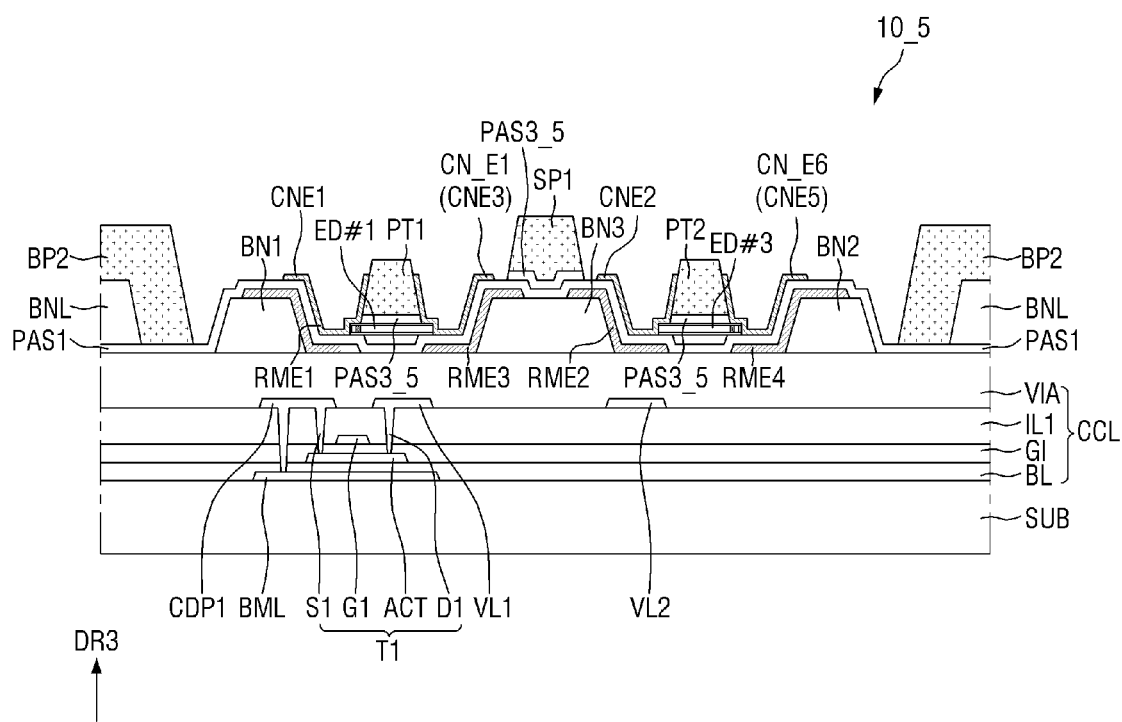
FIG. 25 is a schematic cross-sectional view showing a part of a display device according to an embodiment.

FIG. 25 is a schematic cross-sectional view showing a part of a display device according to an embodiment. FIG. 25 shows a cross section passing through the both ends of connected light-emitting diodes.

Referring to FIG. 25, a display device 10_5 according to an embodiment may further include a third passivation layer PAS3_5 disposed between pattern portions PT1, PT2, PT3 and PT4 of a second passivation layer and light-emitting diodes ED. The third passivation layer PAS3_5 may be formed before the second passivation layer to fix the light-emitting diodes ED. The second passivation layer may be formed after a process of separating electrodes RME at the separation region ROP.

The third passivation layer PAS3_5 may be disposed under or below the pattern portions PT1, PT2, PT3 and PT4 of the second passivation layer and a first support pattern SP1 and may have substantially the same shape. Although not shown in the drawings, the third passivation layer PAS3_5 may have a shape extended in the first direction DR1 between the protruding patterns BN1, BN2 and BN3, and may cover or overlap the light-emitting diodes ED. The both side surfaces of the third passivation layer PAS3_5 may be aligned with the both side surfaces of the pattern portions PT1, PT2, PT3 and PT4 of the second passivation layer, respectively. The third passivation layer PAS3_5 may be formed by applying an insulating material onto the light-emitting diodes ED to cover or overlap them, and by patterning it during the same process as the second passivation layer. As a result, the pattern shape of the third passivation layer PAS3_5 may be substantially identical to the that of the second passivation layer in the schematic plan and schematic cross-sectional views.

According to an embodiment, the third passivation layer PAS3_5 may include an inorganic insulating material unlike the second passivation layer PAS2_4. The third passivation layer PAS3_5 may be made of a material that is more similar to that of the first passivation layer PAS1 than that of the second passivation layer, and may surround the light-emitting diodes ED to fix and protect them.

In concluding the detailed description, those skilled in the art will appreciate that many variations and modifications can be made to the embodiments without substantially departing from the principles of the disclosure. Therefore, the disclosed embodiments are used in a generic and descriptive sense only and not for purposes of limitation.

What is claimed is:
1. A display device comprising:
a first electrode extended in a first direction;
a second electrode spaced apart from the first electrode in a second direction and extended in the first direction;
a first insulating layer disposed on the first electrode and the second electrode;
light-emitting elements disposed on the first insulating layer, each of the light-emitting elements having at least an end disposed on the first electrode or the second electrode;
a second insulating layer disposed on the light-emitting elements and extended in the first direction;
a first connection electrode disposed on the first electrode and electrically contacting the light-emitting elements; and a second connection electrode disposed on the second electrode and electrically contacting the light-emitting elements, wherein each of the first connection electrode and the second connection electrode comprises:
a main portion electrically contacting the light-emitting elements; and
a subsidiary portion having a width smaller than a width of the main portion and electrically connected to the main portion.

2. The display device of claim 1, wherein a first distance between a first main portion of the first connection electrode and a second main portion of the second connection electrode is smaller than a second distance between a first subsidiary portion of the first connection electrode and a second subsidiary portion of the second connection electrode.

3. The display device of claim 2, wherein the first distance is smaller than a length of each of the light-emitting elements extended in the second direction.

4. The display device of claim 2, wherein the second distance is greater than a length of each of the light-emitting elements extended in the second direction.

5. The display device of claim 4, wherein a third distance between the first electrode and the second electrode is smaller than the length of each of the light-emitting elements in the second direction.

6. The display device of claim 2, wherein the light-emitting elements comprise:
first-type light-emitting elements having ends electrically contacting the first main portion of the first connection electrode and the second main portion of the second connection electrode, respectively; and
second-type light-emitting elements having at least one end not contacting the first connection electrode and the second connection electrode and spaced apart from the first subsidiary portion of the first connection electrode or the second subsidiary portion of the second connection electrode in the second direction.

7. The display device of claim 6, wherein at least part of the second-type light-emitting elements have ends not contacting the first connection electrode and the second connection electrode, and spaced apart from the first subsidiary portion of the first connection electrode and the second subsidiary portion of the second connection electrode in the second direction.

8. The display device of claim 6, wherein
the second insulating layer overlaps the first-type light-emitting elements and the second-type light-emitting elements, and
the first main portion and the second main portion contact side surfaces of the second insulating layer disposed on the light-emitting elements, respectively.

9. The display device of claim 2, further comprising:
a bank surrounding an emission area including the light-emitting elements and a subsidiary area spaced apart from the emission area in the first direction,
wherein the first subsidiary portion and the second subsidiary portion extend from a side of the first main portion and the second main portion in the first direction, respectively, and are disposed in the subsidiary area.

10. The display device of claim 9, wherein
the first connection electrode comprises a first electrode contact disposed in the subsidiary area and electrically connected to the first subsidiary portion of the first connection electrode;

the second connection electrode comprises a second electrode contact disposed in the subsidiary area and electrically connected to the second subsidiary portion of the second connection electrode; and
the first electrode contact and the second electrode contact electrically contact the first electrode and the second electrode, respectively.

11. The display device of claim 9, wherein
the first connection electrode further comprises another first subsidiary portion electrically connected to an opposite side of the first main portion of the first connection electrode in the first direction,
the second connection electrode further comprises another second subsidiary portion connected to an opposite side of the second main portion of the second connection electrode in the first direction, and
the emission area comprises:
a light-emitting area including the first main portion and the second main portion; and
a non-light-emitting area including the first subsidiary portion and second subsidiary portion as an area other than the light-emitting area.

12. The display device of claim 11, wherein a length of the second insulating layer measured in the first direction is greater than a width of the light-emitting area in the first direction.

13. A display device comprising:
electrodes extended in a first direction and spaced apart from one another in a second direction perpendicular to the first direction, the electrodes comprising:
a first electrode;
a second electrode spaced apart from the first electrode in the second direction;
a third electrode disposed between the first electrode and the second electrode; and
a fourth electrode spaced apart from the second electrode in the second direction;
a first insulating layer disposed on the electrodes;
first light-emitting elements having ends disposed on the first electrode and the third electrode, respectively, and disposed in the first direction; and
second light-emitting elements having ends disposed on the second electrode and the fourth electrode, respectively, and disposed in the first direction;
a second insulating layer comprising:
a first pattern portion disposed on the first light-emitting elements and extended in the first direction; and
a second pattern portion disposed on the second light-emitting elements and extended in the first direction; and
connection electrodes including:
a first connection electrode disposed on the first electrode;
a second connection electrode disposed on the second electrode;
a third connection electrode disposed across the first electrode and the third electrode;
a fourth connection electrode disposed across the third electrode and the fourth electrode; and
a fifth connection electrode disposed across the second electrode and the fourth electrode, wherein
each of the connection electrodes comprises:
a main portion electrically contacting the light-emitting elements; and
a subsidiary portion having a width smaller than a width of the main portion and electrically connected to the main portion, the main portion and the subsidiary portion of each of the connection electrodes are spaced apart from and face connection electrodes in the second direction, and a first distance between the main portion is smaller than a second distance between the subsidiary portion.

14. The display device of claim 13, wherein the first distance is smaller than a length of the light-emitting elements extended in a direction.

15. The display device of claim 13, wherein the second distance is greater than a length of the light-emitting elements extended in a direction.

16. The display device of claim 13, wherein the light-emitting elements comprise:
   a first-type light-emitting element having ends electrically contacting the main portion of each of the connection electrodes, respectively; and
   a second-type light-emitting element having at least one end not contacting the connection electrodes and spaced apart from the subsidiary portion of each of the connection electrodes in the second direction.

17. The display device of claim 13, wherein the second insulating layer comprises:
   a first support pattern partially disposed on the second electrode and the third electrode and extended in the first direction; and
   bridges having a shape extended in the second direction and electrically connected to at least one of the first pattern portion and the second pattern portion, and the first support pattern.

18. The display device of claim 17, wherein each of the first support pattern and the bridges has a larger width than a width of the first pattern portion and the second pattern portion.

19. The display device of claim 18, wherein the first support pattern is spaced apart from a second main portion of the second connection electrode and a third main portion of the third connection electrode.

20. The display device of claim 17, wherein
   the first pattern portion electrically contacts a main portion of the first connection electrode and a main portion of the third connection electrode, and
   the second pattern portion electrically contacts a main portion of the second connection electrode and a main portion of the fourth connection electrode.

* * * * *